US007196377B2

(12) United States Patent
Kodama et al.

(10) Patent No.: US 7,196,377 B2
(45) Date of Patent: Mar. 27, 2007

(54) MOS TYPE SEMICONDUCTOR DEVICE HAVING ELECTROSTATIC DISCHARGE PROTECTION ARRANGEMENT

(75) Inventors: Noriyuki Kodama, Kanagawa (JP); Koichi Sawahata, Kanagawa (JP); Morihisa Hirata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 148 days.

(21) Appl. No.: 11/111,797

(22) Filed: Apr. 22, 2005

(65) Prior Publication Data

US 2005/0236672 A1   Oct. 27, 2005

(30) Foreign Application Priority Data

Apr. 22, 2004   (JP) ............................. 2004-127219

(51) Int. Cl.
  H01L 23/62   (2006.01)
  H01L 29/72   (2006.01)
  H01L 29/73   (2006.01)
  H01L 29/74   (2006.01)
  H01L 31/111  (2006.01)

(52) U.S. Cl. ...................... 257/355; 257/173; 257/174; 257/356; 257/357; 257/358; 257/359; 257/360; 257/363; 257/368

(58) Field of Classification Search ................ 257/173, 257/355–360, 363, 368
See application file for complete search history.

(56) References Cited

U.S. PATENT DOCUMENTS 6,407,445 B1   6/2002   Vashchenko et al.
6,495,888 B1 * 12/2002  Yamato ...................... 257/355
6,559,507 B1   5/2003   Vashchenko et al.
6,664,599 B1 * 12/2003  Chen et al. .................. 257/355

(Continued)

FOREIGN PATENT DOCUMENTS

JP   2-271674 A   11/1990

(Continued)

OTHER PUBLICATIONS

Article by V.A. Vashchenko et al.; entitled "Increasing the ESD Protection Capability of Over-Voltage NMOS Structures by Comb-Ballasting Region Design"; Reliability Physics Symposium Proceedings; 2003; 41th Annual 2003 IEEE International; Mar. 30-Apr. 4, 2003; pp. 261-268.

(Continued)

Primary Examiner—Ida M. Soward
(74) Attorney, Agent, or Firm—Sughrue Mion, PLLC

(57) ABSTRACT

In a semiconductor device having an electrostatic discharge protection arrangement, a semiconductor substrate exhibits a first conductivity type. First and second impurity regions each exhibiting a second conductivity type are formed in the semiconductor substrate. A channel region is formed in the semiconductor substrate between the first and second impurity regions. A first conductive area is defined on the first impurity region in the vicinity of the channel region. A second conductive area is defined on the first impurity region so as to be supplied with an electrostatic discharge current. A third conductive area is defined on the first impurity region to establish an electrical connection between the first and second conductive area. At least one heat-radiation area is defined in the third conductive area so as to be at least partially isolated therefrom and thermally contacted with the first conductive area.

18 Claims, 17 Drawing Sheets

U.S. PATENT DOCUMENTS

| | | | |
|---|---|---|---|
| 6,777,784 B1 * | 8/2004 | Vashchenko et al. | 257/587 |
| 2004/0155300 A1 * | 8/2004 | Baird et al. | 257/380 |
| 2004/0173836 A1 * | 9/2004 | Oh et al. | 257/303 |

FOREIGN PATENT DOCUMENTS

| | | |
|---|---|---|
| JP | 2773221 B2 | 4/1998 |
| JP | 2996722 B2 | 10/1999 |
| JP | 2000-156501 A | 6/2000 |
| WO | WO 91/05371 A1 | 4/1991 |

OTHER PUBLICATIONS

Article by Bart Keppens et al.; entitled "Active-Area-Segmentation (AAS) Technique for Compact, ESD Robust, Fully Silicided NMOS Design"; Sep. 2003.

Japanese Patent Abstract of 5-505064, published Jul. 29, 1993.

* cited by examiner

MOS TYPE SEMICONDUCTOR DEVICE HAVING ELECTROSTATIC DISCHARGE PROTECTION ARRANGEMENT

BACKGROUND OF THE INVENTION

1. Field of the Invention

The present invention relates to a semiconductor device having an electrostatic discharge (ESD) protection arrangement, which is constituted such that an internal circuit of the semiconductor device is protected from damage caused by ESD phenomena, and more particularly, to an improvement of such an ESD protection arrangement provided in a MOS type semiconductor device.

2. Description of the Related Art

In order to protect an internal circuit of a MOS type semiconductor device from damage caused by ESD phenomena, an ESD protection arrangement is provided in the MOS type semiconductor device. In the MOS type semiconductor device, each of MOS transistors may function as a parasitic bipolar transistor. Usually, each of the MOS transistors carries out a normal operation as a MOS transistor. However, when ESD phenomena occur, the MOS transistor carries out a parasitic bipolar operation, whereby an internal circuit of the MOS type semiconductor device can be protected from damage caused by the ESD phenomena.

In the MOS type semiconductor device, a multi-finger structure is used to effectively constitute the ESD protection arrangement, as disclosed in, for example, JP-A-H2-271674, WO91/05371, JP-A-2000-156501, SP6,559,507, U.S. Pat. No. 6,559,507, V. A. Vashchenko et al., "INCREASING THE ESD PROTECTION CAPABILITY OF OVER-VOLTAGE NMOS STRUCTURES BY COMB-BALLASTING REGION DESIGN" Reliability Physics Symposium Proceedings, 2003, 41st Annual. 2003 IEEE International, Mar. 30–Apr. 4, 2003, P. 261–268, and Bart Keppens, et al., "Active-Area-Segmentation (AAS) Technique for Compact, ESD Robust, Fully Silicided NMOS Design", September, 2003.

In particular, a plurality of elongated gate electrodes are formed on the semiconductor substrate so as to be arranged in parallel to each other at regular intervals, and a high-density impurity region is formed in the semiconductor substrate at an area between two adjacent elongated gate electrodes. One of two adjacent high-density impurity regions is defined as a source region, and the other high-density impurity region is defined as a drain region, with a channel region being defined between the source and drain regions. Namely, in the multi-finger structure, one finger is defined by one of the elongated gate electrodes, and source and drain regions arranged along the respective sides of the elongated gate electrode, with a plurality of MOS transistors being produced and arranged in series along the elongated gate electrode.

When each of the drain regions is supplied with an ESD current, and when an ESD voltage exceeds a predetermined threshold voltage, an avalanche breakdown occurs at a PN junction between the drain region and the channel region, so that a substrate current flows through the semiconductor substrate. The substrate current causes a potential difference in the semiconductor substrate, so that a potential is heightened in the vicinity of the bottom of the source region with respect to a ground voltage. As a result, a PN junction at the bottom of the source region is forwardly biased so that the parasitic bipolar transistor is turned ON, resulting in considerable decline of the voltage, which is called a snapback. Thus, a source-drain resistance is decreased so that a large amount of current flows through the parasitic bipolar transistor, whereby the ESD current is safely discharged.

Nevertheless, in the prior art MOS type semiconductor device having the ESD protection arrangement, it is difficult to constitute the ESD protection arrangement so that it can operated properly, for the various reasons stated in detail hereinafter.

On the other hand, when the ESD protection arrangement is operated, an internal heating in each of the transistors mainly occurs at the PN junction area of the drain region in the vicinity of the channel region. Namely, when the ESD current flows through the PN junction between the drain region and the channel region, heat is generated at the PN junction area of the drain region in the vicinity of the channel region. Of course, the heat must be rapidly dispersed so that the ESD protection arrangement is not subjected to thermal damage. This thermal damage problem is very severe in that there is a recent trend to a lowering of process temperatures in manufacturing of semiconductor devices, resulting in inferiority of a heat-resistance of the semiconductor devices.

SUMMARY OF THE INVENTION

Therefore, an object of the present invention is to provide a MOS type semiconductor device having an electrostatic discharge (ESD) protection arrangement, in which not only can a proper operation of the ESD protection arrangement be ensured, but also a thermal dispersion problem can be considerably improved.

In accordance with a first aspect of the present invention, there is provided a semiconductor device having an electrostatic discharge protection arrangement, which comprises a semiconductor substrate exhibiting a first conductivity type, a first impurity region formed in the semiconductor substrate and exhibiting a second conductivity type, a second impurity region formed in the semiconductor substrate and exhibiting the second conductivity type, a channel region formed in the semiconductor substrate between the first and second impurity regions, a first conductive area defined on the first impurity region in the vicinity of the channel region, a second conductive area defined on the first impurity region so as to be supplied with an electrostatic discharge current, a third conductive area defined on the first impurity region to establish an electrical connection between the first and second conductive area, and at least one heat-radiation area defined in the third conductive area so as to be at least partially isolated therefrom and thermally contacted with the first conductive area.

The semiconductor device may further comprise a high resistance region formed in the first impurity region for the at least partial isolation of the heat-radiation area. Also, the semiconductor device may further comprise a floating heat sink which is in thermal contact with the heat-radiation area.

The floating heat sink may be in thermal contact with the first conductive area. The heat-radiation area may have a silicide layer formed thereon.

The first impurity region may have a silicide layer formed thereon, and the third conductive area may be defined as a silicide-blocking area. The heat-radiation area may be arranged in and isolated from the silicide-blocking area.

The semiconductor device may further comprise a conductive floating heat sink associated with the first conductive area and the third conductive area to thereby establish an electrical connection therebetween. The third conductive area may be isolated from the first conductive area.

In the semiconductor device, preferably, a plurality of heat-radiation areas are defined in the third conductive area so that the third conductive area is divided into conductive area sections, which are extended between the first and second conductive areas. The second conductive area may be divided into conductive area sections by high resistance regions formed in the first impurity region, the respective conductive sections of the third conductive area being connected to the conductive area sections of the second conductive area. Each of the conductive area sections of the second conductive area may have a contact plug formed thereon.

In the semiconductor device, the heat-radiation area may be defined as an exposed surface of the first impurity region. Also, the heat-radiation area may be defined as a layer composed of a material, a resistance of which becomes higher in accordance with a raise in temperature. For such a material, it possible to use polycrystalline silicon.

In accordance with a second aspect of the present invention, there is provided a semiconductor device having an electrostatic discharge protection arrangement, which comprises a semiconductor substrate exhibiting a first conductivity type, a first impurity region formed in the semiconductor substrate and exhibiting a second conductivity type, a second impurity region formed in the semiconductor substrate and exhibiting the second conductivity type, a channel region formed in the semiconductor substrate between the first and second impurity regions, a first conductive area defined on the first impurity region in the vicinity of the channel region, a second conductive area defined on the first impurity region so as to be supplied with an electrostatic discharge current, a third conductive area defined on the first impurity region to establish an electrical connection between the first and second conductive area, and a plurality of floating heat sinks associated with the first conductive area and arranged alone the channel region.

In this second aspect of the present invention, the third conductive area may be defined as an annular area surrounding the second conductive area section. Also, the third conductive area may be divided into conductive area sections, each of the conductive area sections being isolated by high resistance regions formed in the first impurity region.

BRIEF DESCRIPTION OF THE DRAWINGS

The above objects and other objects will be more clearly understood from the description set forth below, with reference to the accompanying drawings, wherein.

DESCRIPTION OF THE PREFERRED EMBODIMENTS

Before description of the preferred embodiments of the present invention, for better understanding of the present invention, a first prior art MOS type semiconductor device having an electrostatic discharge (ESD) protection arrangement will be explained with reference to FIGS. 1 and 2.

Figure 1:
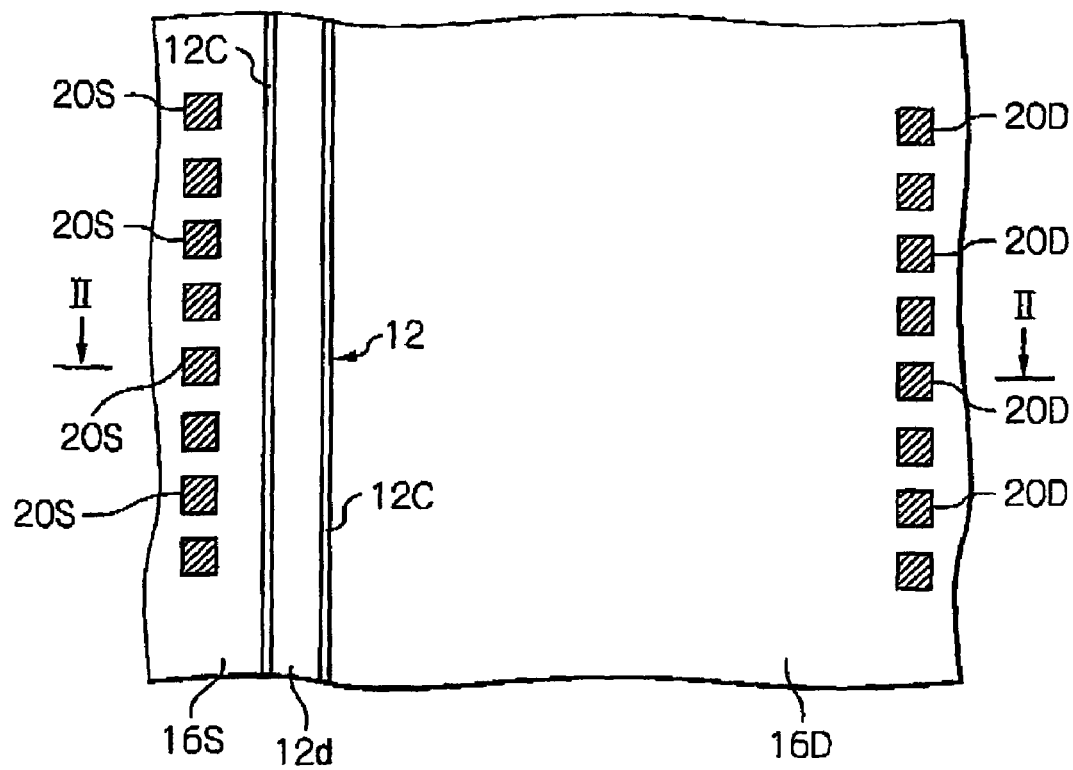
FIG. 1 is a vertical partial cross-sectional view taken along the I—I line of FIG. 2, showing a first prior art MOS type semiconductor device having an electrostatic discharge (ESD) protection arrangement.

As shown in FIG. 1, the first prior art MOS type semiconductor device includes a P⁻-type semiconductor substrate 10, which is derived from, for example, a P⁻-type monocrystalline silicon wafer. This prior art MOS type semiconductor device features a multi-finger structure for effectively constituting the ESD protection arrangement.

In particular, a plurality of elongated gate electrodes 12 are formed on the P⁻-type semiconductor substrate 10 so as to be arranged in parallel to each other at regular intervals. Note, only one elongated gate electrode 12 is representatively illustrated in FIGS. 1 and 2. As shown in FIG. 2, each of the elongated gate electrodes 12 includes has a gate insulating layer 12a formed as a silicon dioxide layer on the P⁻-type semiconductor substrate 10, a gate electrode layer 12b formed as a polycrystalline silicon layer on the gate insulating layer 12a, a side wall 12c formed along the side faces of both the gate insulating layer 12a and the gate electrode layer 12b, and a silicide layer 12d formed on a top surface of the gate electrode layer 12b.

In the multi-finger structure, for example, an N⁺-type impurity region is formed in the P⁻-type semiconductor substrate 10 at an area between two adjacent elongated gate electrodes 12. The N⁺-type impurity region, indicated by reference 14S, is defined as a source region, and the N⁺-type impurity region, indicated by reference 14D, is defined as a drain region, with a channel region 14C being defined between the source and drain regions 14S and 14D. Namely, the source and drain regions 14S and 14D are formed in the P⁻-type semiconductor substrate 10 so as to be alternately arranged.

Figure 2:
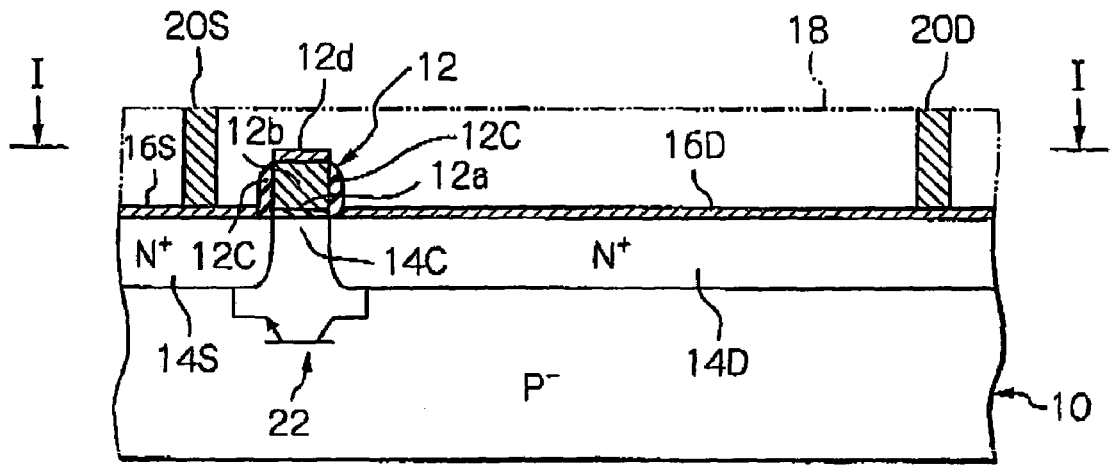
FIG. 2 is a horizontal partial cross-sectional taken along the line II—II of FIG. 1.

As shown in FIGS. 1 and 2, a silicide layer 16S is formed over each of the source regions 14S, and a silicide layer 16D is formed over each of the source regions 14D. Also, an insulating interlayer 18 is formed over the surface of the P⁻-type semiconductor substrate 10. Note, the insulating interlayer 18 is represented by a phantom line in FIG. 2, for the sake of convenience for illustration.

Two arrays of contact plugs 20S are formed in the insulating interlayer 18 above each of the source regions 14S so as to be in contact with the silicide layer 16S, and each array of contact plugs 20S is arranged along a corresponding elongated gate 12, as shown in FIG. 2. An array of contact plugs 20D is formed in the insulating interlayer 18 above each of the drain regions 14D so as to be in contact with the silicide layer 16D, and is arranged at the center of the drain region 14D in parallel with the elongated gates 12 extending along the sides of the drain region 14D.

In short, in the MOS type semiconductor device featuring the multi-finger structure shown in FIGS. 1 and 2, one finger is defined by one of the elongated gate electrodes 12, and source and drain regions 14S and 14D arranged along the respective sides of the elongated gate electrode 12, with a plurality of MOS transistors being produced and arranged in series along the elongated gate electrode 12. Note, each of the fingers has a width falling within range from approximately 10 μm to approximately 50 μm.

As symbolically shown in FIG. 2, each of the MOS transistors produces a parasitic NPN type bipolar transistor 22, and the parasitic NPN type bipolar transistor 22 forms a part of the ESD protection arrangement. Usually, each of the MOS transistors carries out a normal operation as an N-channel type MOS transistor. However, when ESD phenomena occur, the MOS transistor carries out a parasitic bipolar operation, whereby an internal circuit of the MOS type semiconductor device can be protected from damage caused by the ESD phenomena.

Figure 3:
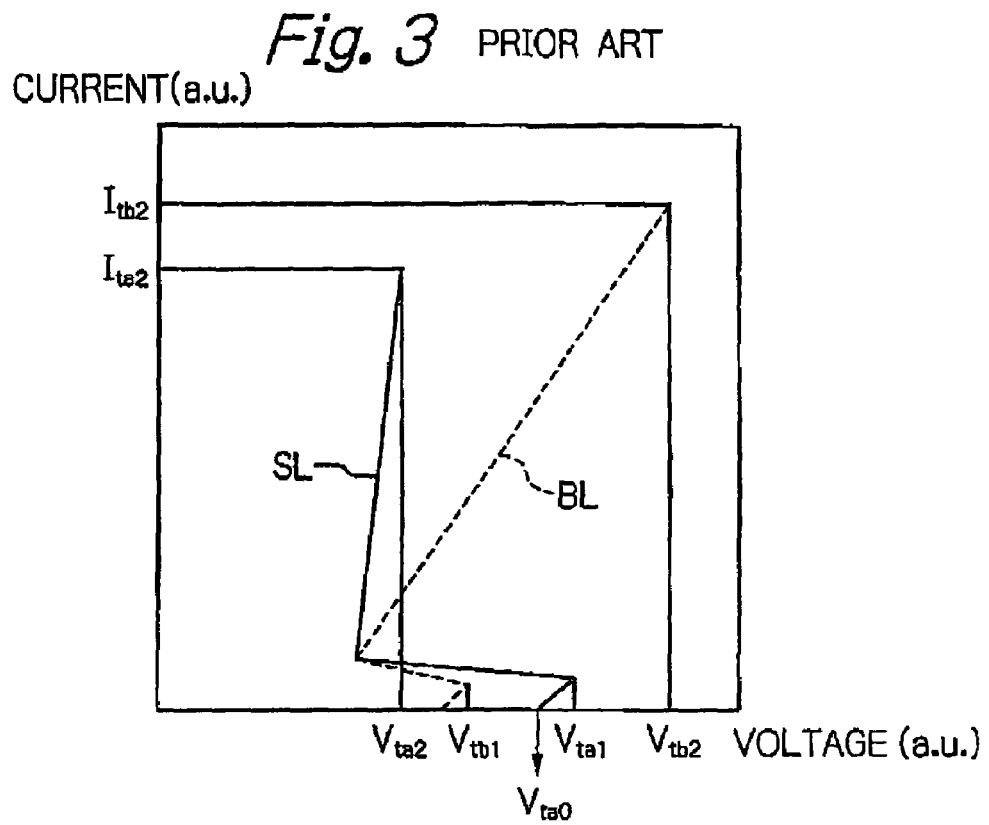
FIG. 3 is a graph showing a current/voltage characteristic of the first prior art MOS type semiconductor device together with a current/voltage characteristic of a second prior art MOS type semiconductor device having an ESD protection arrangement.

With reference to a graph of FIG. 3, a current/voltage characteristic of the above-mentioned first prior art MOS type semiconductor device having the ESD protection arrangement is represented by a solid line SL. As shown in this graph, when the drain region 14D is supplied with an ESD current, and when an ESD voltage exceeds a predetermined threshold voltage $V_{ta0}$, an avalanche breakdown occurs at a PN junction between the drain region 14D and the channel region 14C, so that a substrate current flows through the P⁻-type semiconductor substrate 10. The substrate current causes a potential difference in the P⁻-type semiconductor substrate 10, so that a potential is heightened in the vicinity of the bottom of the source region 14S with respect to a ground voltage. As a result, a PN junction at the bottom of the source region 14S is forwardly biased so that the parasitic bipolar transistor 22 is turned ON, resulting in considerable decline of the voltage, which is called a snapback. Thus, a source-drain resistance is decreased so that a large amount of current flows through the parasitic bipolar transistor 22, whereby the ESD current is safely discharged.

Note, in the graph of FIG. 3, a voltage $V_{ta1}$, at which the snapback occurs, is called a trigger voltage.

On the other hand, an internal heating in each of the transistors mainly occurs at a PN junction area of the drain region 14D in the vicinity of the channel region 14C. Namely, when the current is once crowded at the PN junction area of the transistor, a temperature of the PN junction area is raised so that the current flowing through the PN junction area becomes larger, resulting in thermal damage of the transistor. This thermal damage problem is very severe in that there is a recent trend to a lowering of process temperatures in manufacturing of semiconductor devices, resulting in inferiority of a heat-resistance of the semiconductor devices.

Also, in the multi-finger structure of the above-mentioned first prior art MOS type semiconductor device, respective distances, which are measured from the fingers to a ground electrode (usually called a guard ring), are different from each other, and thus snapbacks cannot simultaneously occur in all the fingers. Namely, since the P⁻-type semiconductor substrate 10 exhibits a high substrate resistance at a central area thereof, a snapback is liable to occur first of all at a central finger arranged at the central area of the semiconductor substrate 10.

When the snapback once occurs at the central finger, a resistance at the central finger becomes smaller than those at the other fingers, and thus currents are crowded at the central finger. In general, since a resistance of a transistor itself, inclusive of a parasitic resistance, is relatively small, a breakdown voltage $V_{ta2}$, at which a breakdown current $I_{ta2}$ flows through the central finger, is lower than the trigger voltage $V_{ta1}$, as shown in the graph of FIG. 3. Namely, when the breakdown voltage $V_{ta2}$ is lower than the trigger voltage $V_{ta1}$, the snapback occurs at only the central finger (at which the substrate resistance is high) or only a part of the central finger, and thus no snapback occur at the other fingers. In this case, it is impossible to discharge ESD currents at the other fingers. Thus, as long as the breakdown voltage $V_{ta2}$ is lower than the trigger voltage $V_{ta1}$, it is impossible to effectively make use of the multi-finger structure of the semiconductor device.

Accordingly, in the multi-finger structure of the semiconductor device, the ESD protection arrangement must be constituted such that the snapbacks can occur at all the fingers. Namely, it is necessary to set the breakdown voltage $V_{ta2}$ so as to make it higher than the trigger voltage $V_{ta1}$, before occurrence of the snapbacks at all the fingers can be ensured.

Figure 4:
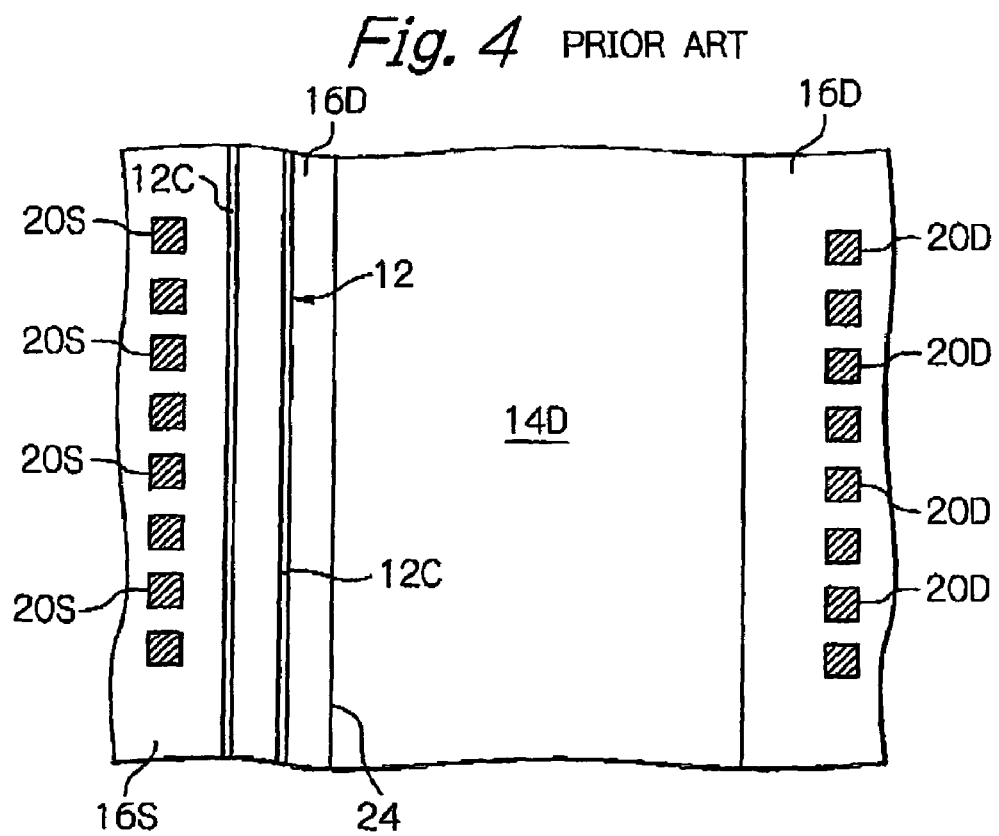
FIG. 4 is a horizontal partial cross-sectional view, similar to FIG. 2, showing the second prior art MOS type semiconductor device.

FIG. 4, similar to FIG. 2, shows a second prior art MOS type semiconductor device having an ESD protection arrangement. Note, in FIG. 4, the features similar to those of FIG. 2 are indicated by the same references.

In this second prior art MOS type semiconductor device, a ballast resistance is added to the drain region 14D by forming a silicide-blocking area 24 in the silicide layer 14D. Namely, the resistance at the drain region 14D is heightened due to the existence of the silicide-blocking area 24 from which the silicide material is blocked out, so that the occurrence of the snapbacks at all the fingers is ensured.

With reference to a graph of FIG. 3, a current/voltage characteristic of the second prior art MOS type semiconductor device having the ESD protection arrangement is represented by a broken line BL. As is apparent from this graph, due to the addition of the ballast resistance to the drain region 14D, a trigger voltage $V_{tb1}$ is made to be lower than the trigger voltage $V_{ta1}$, and a breakdown voltage $V_{tb2}$ corresponding to a breakdown current $I_{tb2}$ is made to be higher than the trigger voltage $V_{ta1}$. Thus, in the second prior art MOS type semiconductor device having the ESD protection arrangement, it is possible to ensure the occurrence of the snapbacks at all the fingers.

In short, by suitably adding a ballast resistance to the drain region 14D, it is possible to adjust an inclination of the current/voltage characteristic such that the breakdown voltage is made to be higher than the trigger voltage.

Note, the addition of the ballast resistance to the resistance at the drain region is disclosed in, for example, JP-A-H2-271674, JP-A-2000-156501, and U.S. Pat. No. 6,559,507.

Also, it is known that a suitable resistor element is connected to the gate electrode layer (12b) so that the trigger voltage is made to be lower than the breakdown voltage. Further, there is a case where the addition of the ballast resistance to the drain region (14D) and the connection of the resistor element to the gate electrode layer (12b) are combined with each other.

On the other hand, the addition of the ballast resistance to the drain region (14D) and the connection of the resistor element to the gate electrode layer (12b) are unnecessary as long as the substrate resistance of the P⁻-type semiconductor substrate 10 is sufficiently high so that the trigger voltage is made to be lower than the breakdown voltage whereby the occurrence of the snapbacks at all the fingers can be ensured.

A width of the drain region is apt to be widened to give a sufficient resistance to the drain region (14D) because the trigger voltage must be made to be lower that the breakdown voltage. This is contradictory to the trend toward miniaturization of semiconductor devices.

Figure 5:
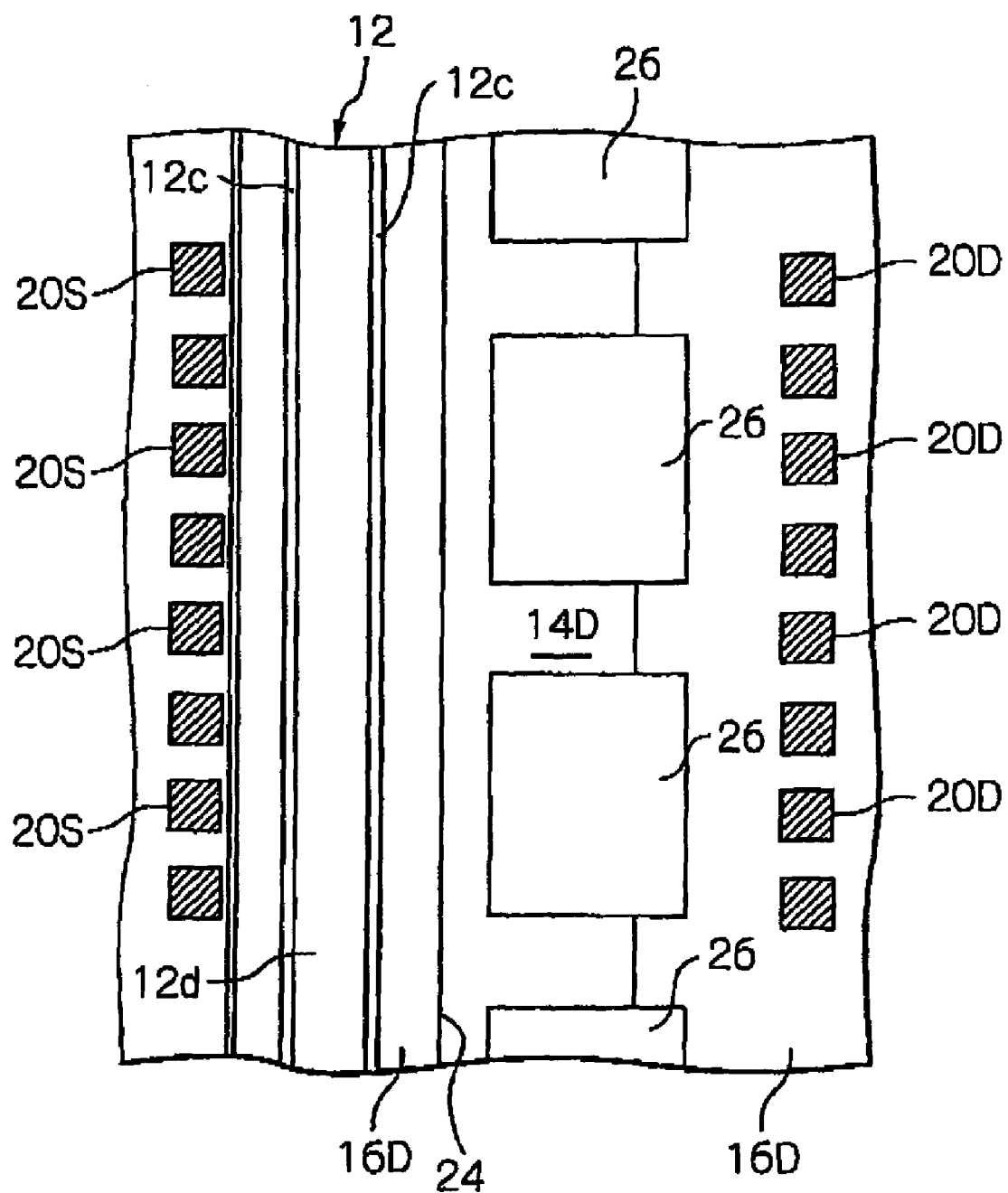
FIG. 5 is a horizontal partial cross-sectional view, similar to FIG. 4, showing a third prior art MOS type semiconductor device having an ESD protection arrangement.

FIG. 5, similar to FIG. 4, shows a third prior art MOS type semiconductor device having an ESD protection arrangement. Note, in FIG. 4, the features similar to those of FIG. 2 are indicated by the same references.

In this third prior art MOS type semiconductor device having the ESD protection arrangement, a width of the drain region 14D is made to be narrower than that of the drain region shown in FIG. 4, but a plurality of high resistance island regions 26 are formed in the drain region 14D to thereby make the resistance of the drain region 14D higher. Each of the high resistance island regions 26 may be defined as either a N-type lightly doped drain (NLDD) or a shallow trench isolation (STI) region. Accordingly, similar to the second prior art MOS type semiconductor device shown in FIG. 4, it is possible to make the trigger voltage lower than the breakdown voltage, whereby the occurrence of the snapbacks at all the fingers can be ensured.

Note, the formation of the high resistance island regions (26) in the drain region (14D) is disclosed in, for example, U.S. Pat. No. 6,559,507, and the literature V. A. Vashchenko, A. Conannon, M. ter Beek, and P. Hopper, "INCREASING THE ESD PROTECTION CAPABILITY OF OVER-VOLTAGE NMOS STRUCTURES BY COMB-BALLASTING REGION DESIGN" Reliability Physics Symposium Proceedings, 2003, 41st Annual. 2003 IEEE International, Mar. 30–Apr. 4, 2003, P. 261–268.

Although the above-mentioned third prior art MOS type semiconductor device can contribute to the miniaturization trend, it involves a heat dispersion problem. In particular, when a current flows through the PN junction between the drain region and the channel region due to the ESD phenomena, heat is generated in the vicinity of the PN junction between the drain region and the channel region, but the dispersion of the heat is hindered due to the existence of the high resistance island regions 26, because the high resistance island regions 26, each of which is defined as either the N-type lightly doped drain (NLDD) region or the shallow trench isolation (STI) region, exhibit a thermal conductivity inferior to those of the drain region 14D and the silicide layer 16D. Thus, the third prior art MOS type semiconductor device having the ESD protection arrangement is susceptible to thermal damage.

Figure 6:
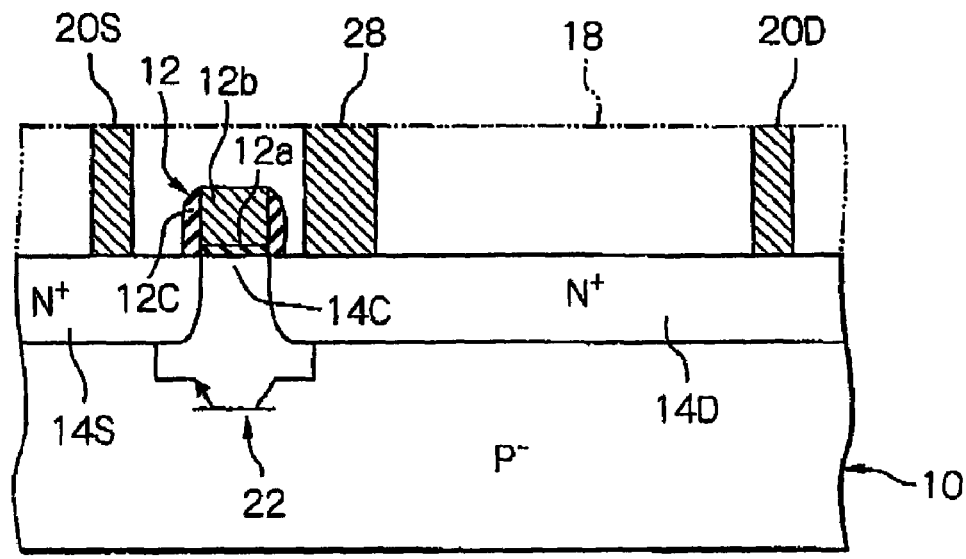
FIG. 6 is a vertical partial cross-sectional view, similar to FIG. 1, showing a fourth prior art MOS type semiconductor device having an ESD protection arrangement and featuring a floating heat sink.

FIG. 6, similar to FIG. 1, shows a fourth prior art MOS type semiconductor device having an ESD protection arrangement, as disclosed in U.S. Pat. No. 6,407,445. Note, in FIG. 6, the features similar to those of FIG. 1 are indicated by the same references.

In this fourth prior art MOS type semiconductor device, no silicate layer (16S, 16D) is formed on each of the source and drain regions 14S and 14D, and the respective contact plugs 20S and 20D are in contact with the source and drain regions 14S and 14D.

In order to resolve the aforesaid heat dispersion problem, the fourth prior art MOS type semiconductor features a floating heat sink 28 made of a suitable metal material. The floating heat sink 28 is formed in the insulating interlayer 18 so as to be in contact with the drain region 14D, and is arranged along the elongated gate electrode 12. Thus, the heat, which is generated in the vicinity of the PN junction between the drain region 14D and the channel region 14C, can be conducted into and dispersed over the floating heat sink 28.

Figure 7:
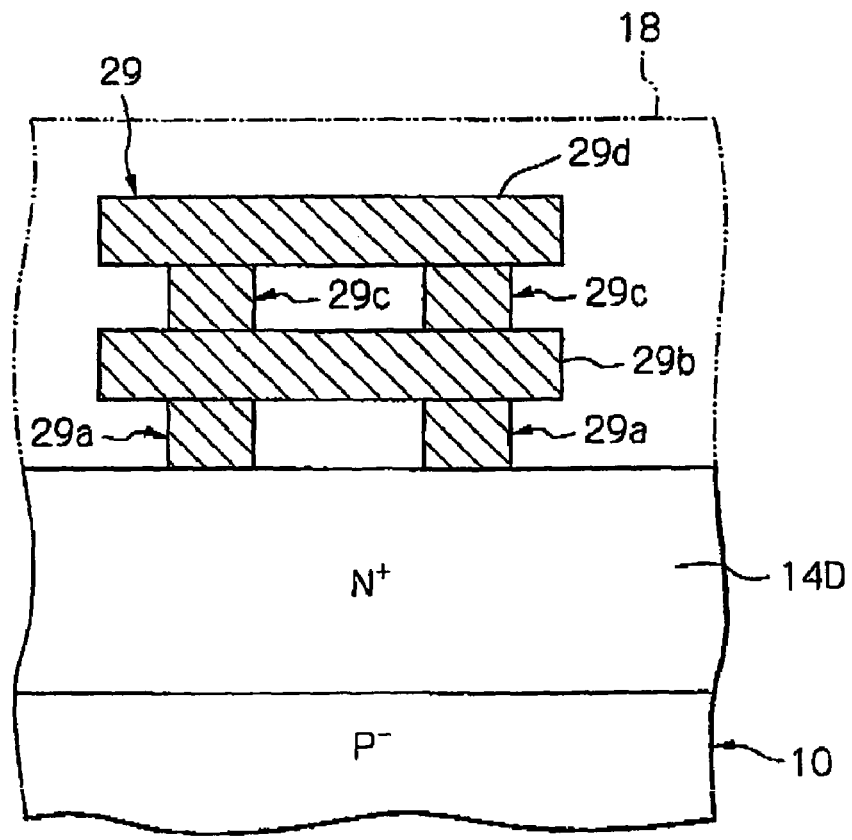
FIG. 7 is a partially-enlarged vertical cross-sectional view of FIG. 6, showing another type floating heat sink which is substituted for the floating heat sink shown in FIG. 6.

Also, U.S. Pat. No. 6,407,445 discloses another floating heat sink 29 made of a suitable metal material, as shown in FIG. 7. This floating heat sink 29 also is formed in the insulating interlayer 18 so as to be in contact with the drain region 28, which is arranged along the elongated gate electrode 12.

As shown in FIG. 7, the floating heat sink 29 includes two arrays of metal plugs 29a formed on the drain region 14D and arranged along the elongated gate electrode 12, a metal layer 29b on the two arrays of metal plugs 29a, two arrays of metal plugs 29c formed on the metal layer 29b and arranged along the elongated gate electrode 12, and a metal layer 29d on the two arrays of metal plugs 29c.

In the above-mentioned fourth prior art MOS type semiconductor device, ESD currents flow through the floating heat sink (28, 29) extending along the elongated gate electrode 12, these ESD currents are apt to be crowded at a local area of a finger which exhibits a low resistance, and thus a breakdown may occur at that local area.

Further, in the above-mentioned fourth MOS type semiconductor device, it is difficult to completely resolve the heat dispersion problem because the floating heat sink (28, 29) is relatively small so as not to have a sufficient thermal capacity.

First Embodiment

Figure 8:
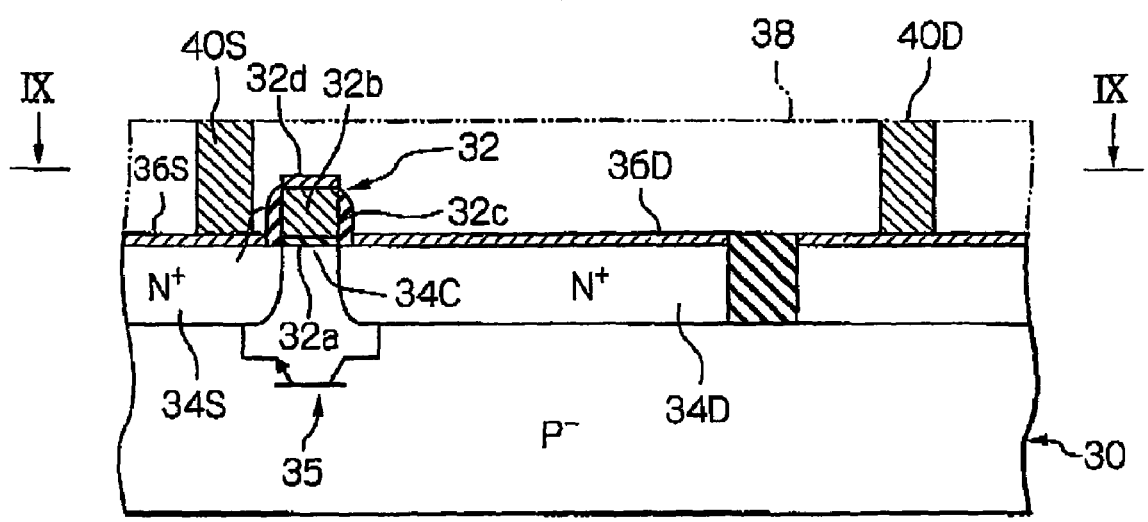
FIG. 8 is a vertical partial cross-sectional view taken along the IIX—IIX line of FIG. 9, showing a first embodiment of a MOS type semiconductor device having an ESD protection arrangement according to the present invention.
Figure 9:
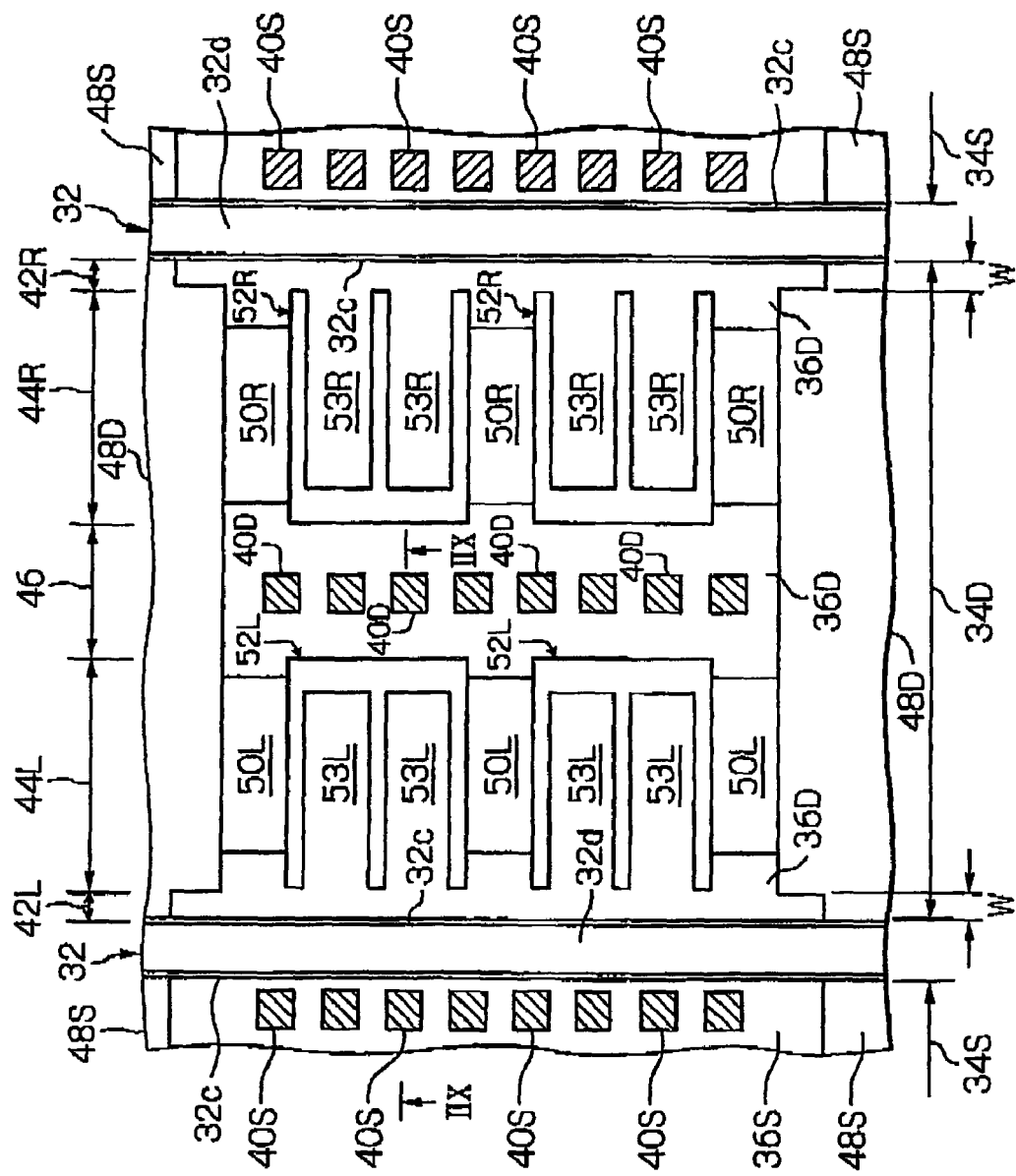
FIG. 9 is a horizontal partial cross-sectional taken along the line IX—IX of FIG. 8.

With reference to FIGS. 8 and 9, a first embodiment of a MOS type semiconductor device having an ESD protection arrangement according to the present invention is explained below.

As shown in FIG. 8, the MOS type semiconductor device includes a P⁻-type semiconductor substrate 30, which is derived from, for example, a P⁻-type monocrystalline silicon wafer. This MOS type semiconductor device features a multi-finger structure for effectively constituting the ESD protection arrangement.

In particular, as shown in FIG. 9, a plurality of elongated gate electrodes 32 are formed on the P⁻-type semiconductor substrate 30 so as to be arranged in parallel to each other at regular intervals. As shown in FIG. 8, each of the elongated gate electrodes 32 includes has a gate insulating layer 22a formed as a silicon dioxide layer on the P⁻-type semiconductor substrate 30, a gate electrode layer 32b formed as a polycrystalline silicon layer on the gate insulating layer 32c, a side wall 32c formed along the side faces of both the gate insulating layer 32a and the gate electrode layer 32b, and a silicide layer 32d formed on a top surface of the gate electrode layer 32b.

In the multi-finger structure, for example, an N⁺-type impurity region is formed in the P⁻-type semiconductor substrate 30 at an area between two adjacent elongated gate electrodes 32. In FIG. 8, the N⁺-type impurity region, indicated by reference 34S, is defined as a source region, and the N⁺-type impurity region, indicated by reference 34D, is defined as a drain region, with a channel region 34C being defined between the source and drain regions 34S and 34D. Namely, the source and drain regions 34S and 34D are alternately defined at the areas between the elongated gate electrodes 32.

In short, in the multi-finger structure, one finger is defined by one of the elongated gate electrodes 32, and the source and drain regions 34S and 34D arranged along the respective sides of the elongated gate electrode 32. Either the source region 34S or the drain region 34D is commonly used in two adjacent fingers, and a plurality of MOS transistors are produced and arranged in series along the elongated gate electrode 32. As symbolically shown in FIG. 8, each of the MOS transistors produces a parasitic NPN type bipolar transistor 35, and the parasitic NPN type bipolar transistor 35 forms a part of the ESD protection arrangement.

As shown in FIGS. 8 and 9, a silicide layer 36S is formed on each of the source regions 34S, and a silicide layer 36D is formed on each of the source regions 34D. Also, an insulating interlayer 38 is formed over the surface of the P⁻-type semiconductor substrate 30. Note, the insulating interlayer 38 is represented by a phantom line in FIG. 8, for the sake of convenience for illustration.

Two arrays of contact plugs 40S are formed as source electrodes in the insulating interlayer 38 above each of the source regions 34S so as to in contact with a corresponding silicide layer 36S, and each array of metal contact plugs is arranged along a corresponding elongated gate 32, as shown in FIG. 9. An array of contact plugs 40D is formed as drain electrodes in the insulating interlayer 38 above each of the drain regions 34D so as to be in contact with a corresponding silicide layer 36D, and is arranged at the center of the drain region 34D in parallel with the elongated gates 32 extending along the drain region 34D.

As shown in FIG. 9, the surface of each of the drain regions 40D is sectioned into a channel-proximity area 42L, a middle area 44L, a central contact-formation area 46, a middle area 44R, and a channel-proximity area 42R. Note, in FIG. 9, reference 48S indicates element-isolation layers defining the source regions 34S, each of which is formed as an STI region, and reference 48D indicates element-isolation layers defining the drain regions 34D, each of which formed as an STI region.

In this embodiment, at the middle area 44L, three silicide-blocking areas 50L are formed in the silicide layer 36D. Similarly, at the middle area 44R, three silicide-blocking areas 50L are formed in the silicide layer 36D. Each of the silicide-blocking areas 50R serves as a ballast resistance area from which the silicide material is blocked out.

Also, at the middle area 44L, two comb-like high resistance regions 52L are formed in the drain region 34D, and are arranged between the silicide-blocking areas 50L. Each of the comb-like high resistance regions 52L has abeam section partially penetrating into the silicide layer 36D formed on the contact-formation area 46, and three tooth sections extending from the beam section to the boundary between the channel-proximity area 42L and the contact-formation area 46. As shown in FIG. 9, the silicide layer 36D extends from the channel-proximity area 42L into the middle area 44L so as to occupy the spaces between the tooth sections of each of the two comb-like high resistance regions, 52L, and each of the silicide layer sections occupying the spaces between the tooth sections serves as a heat sink area or heat-radiation area, as indicated by reference 53L. Namely, the heat-radiation areas 53L are connected to only the silicide layer 36D formed on the channel-proximity area 42L, and are isolated from the ballast resistance area 50L and the contact-formation area 44R by the two comb-like high resistance regions 52L.

Similarly, at the middle area 44D, two comb-like high resistance regions 52R are formed in the drain region 34D, and are arranged between the silicide-blocking areas 50R. Each of the comb-like high resistance regions 52R has abeam section partially penetrating into the silicide layer 36D formed on the contact-formation area 46, and three tooth sections extending from the beam section to the boundary between the channel-proximity area 42R and the contact-formation area 46. As shown in FIG. 9, the silicide layer 36D extends from the channel-proximity area 42R into the middle area 441 so as to occupy the spaces between the tooth sections of each of the two comb-like high resistance regions 52R, and each of the silicide layer sections occupying the spaces between the tooth sections serves as a heat-radiation area, as indicated by reference 53R. Namely, the heat-radiation areas 53R are connected to only the silicide layer 36D formed on the channel-proximity area 42R, and are isolated from the ballast resistance area 50R and the contact-formation area 44R by the two comb-like high resistance regions 52R.

Note, each of the two comb-like high resistance regions 52L and 52R may be formed as either an STI region or an NLDD region. Also, note, as is apparent from FIG. 9, the two comb-like high resistance regions 52L and 52R are symmetrical with respect to each other.

Although not shown in FIGS. 8 and 9, the MOS type semiconductor device includes an internal circuit formed on another area on the P⁻-type semiconductor substrate 30, and the internal circuit has a plurality of input/output pads connected to the contact plugs 40D. The ESD protection arrangement includes an ESD current circuit formed of the input/output pads, the contact plugs 40D, the contact formation area 46, the ballast resistance areas (50L, 50R) and the channel-proximity area (42L, 42R). Note, the heat-radiation areas (53L, 53R) do not participate in the formation of the ESD current circuit.

In operation, usually, each of the MOS transistors carries out a normal operation as a MOS transistor. However, when ESD phenomena occur, the MOS transistor carries out a parasitic bipolar operation, whereby the internal circuit of the MOS type semiconductor device can be protected from damage caused by the ESD phenomena.

In particular, when each of the drain regions 34D is supplied with an ESD current through the input/output pads, the contact plugs 40D and the contact-formation area 46, and when an ESD voltage exceeds a predetermined threshold voltage, an avalanche breakdown occurs at a PN junction between the drain region 34D and the channel-proximity region (42L, 42R), so that a substrate current flows through the P⁻-type semiconductor substrate. The substrate current causes a potential difference in the P⁻-type semiconductor substrate 30, so that a potential is heightened in the vicinity of the bottom of the source region with respect to a ground voltage. As a result, a PN junction at the bottom of the source region is forwardly biased so that the parasitic bipolar transistor is turned ON, resulting in considerable decline of the voltage, which is called a snapback. Thus, a source-drain resistance is decreased so that a large amount of current flows through the parasitic bipolar transistor 35, whereby the ESD current is safely discharged through the intermediary of the source regions 34S and the contact plugs 40S. Thus, it is possible to protect the internal circuit of the MOS type semiconductor device from damage caused by the ESD phenomena.

In this embodiment, in the middle area (44L, 44R), since current paths for the ESD current are defined by only the silicide-blocking areas or ballast resistance areas (50L, 50R), the middle area (44L, 44R) exhibits a high resistance so that the ESD current flowing into the finger, at which the snapback initially occurs, is restricted so that the ESD current can flow into another finger. For example, the drain region (N⁺-type impurity region) 34D in the middle area (44L, 44R) exhibits a considerably higher sheet resistance of approximately 100 Ω/□ than that of the silicide layer 36D, which may be on the order of 10 Ω/□. As a result, snapbacks can occur one after another at the remaining fingers, and thus it is possible to securely ensure the protection of the internal circuit of the semiconductor device.

Further, as is apparent from the foregoing, since each of the heat-radiation areas 53L and 53R are defined as a part of the silicide layer 36D which exhibits a thermal conductivity superior to that of each of the comb-like high resistance regions 52L and 52R, a heat generated in the vicinity of the PN junction between the drain region 34D and the channel-proximity region 34C can be rapidly dispersed over the heat-radiation areas 53L and 53R. Thereafter, the heat is dissipated in the P⁻-type semiconductor substrate 30. Thus, it is possible to protect the MOS type semiconductor device from thermal damage.

In the above-mentioned first embodiment, when a width W of the channel-proximity area (42L, 42R) is too wide (FIG. 9), the ESD current flows lengthwise through the channel-proximity area (42L, 42R) along the elongated gate electrode 32, and crowding of the ESD current may occur at the channel-proximity area (42L, 42R). On the contrary, when a width W of the channel-proximity area (42L, 42R) is too narrow, a resistance of the channel-proximity area (42L, 42R) may be fluctuated lengthwise along the elongated gate electrode 32. In order to avoid these disadvantages, the width W should be approximately 0.5.

Second Embodiment

Figure 10:
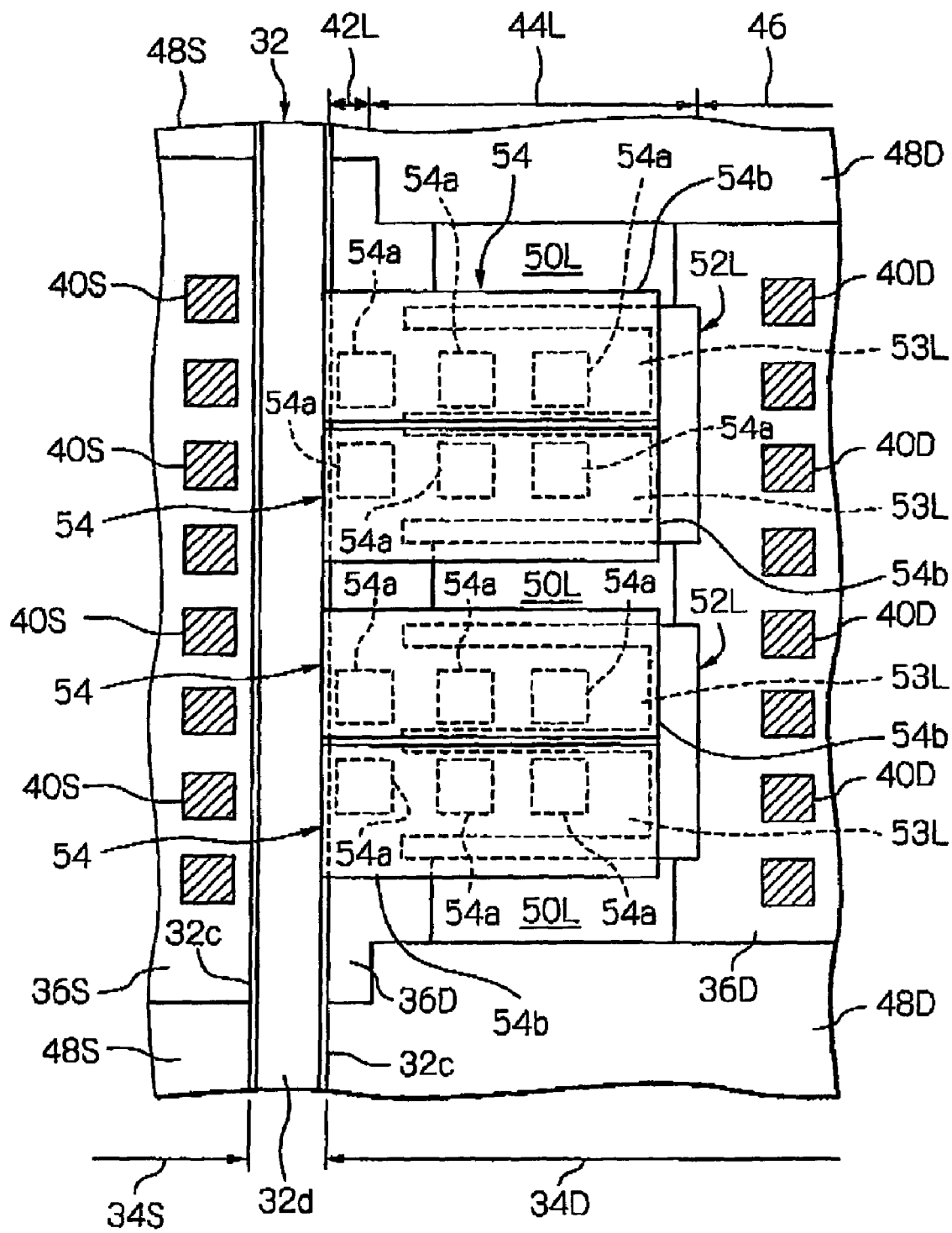
FIG. 10 is a vertical partial cross-sectional view, similar to FIG. 8, showing a second embodiment of the MOS type semiconductor device having the ESD protection arrangement according to the present invention.

FIG. 10 shows a second embodiment of the MOS type semiconductor device having the ESD protection arrangement according to the present invention. Note, in FIG. 10, the features similar to those of FIG. 9 are indicated by the same references.

This second embodiment is substantially identical to the above-mentioned first embodiment except that a floating heat sink 54 is formed in the insulating interlayer (38) at each of the drain areas 34D so as to be associated with each of the heat sink area or heat-radiation areas 53L. In particular, each of the floating heat sinks 54 includes three metal plugs 54a formed on the silicide layer 36D formed on both the channel-proximity area 42L and the middle area 44L, and a metal layer 54b formed on the metal plugs 54a. As shown in FIG. 10, one of the three metal plugs 54a is arranged on the channel-proximity area 42L, and the remaining two metal plugs 54a are arranged on a corresponding heat-radiation area 53L.

Note, although not illustrated in FIG. 10, a floating sink similar to the floating heat sink 54 is formed in the insulating interlayer (38) at each of the drain areas 34D so as to be associated with each of the other heat-radiation areas (53R).

According to the second embodiment, since each of the heat-radiation areas 53L is associated with one or the floating heat sinks 54, it is possible to facilitate the dispersion of the heat in comparison with the above-mentioned first embodiment shown in FIGS. 8 and 9. Also, in the second embodiment, since the floating heat sinks 54 do not participate in the formation of the ESD current circuit, the ballast resistance in the silicate-blocking areas 50L cannot be reduced due to the existence of the floating heat sinks 54. Further, since the ESD current does not flow through the floating heat sinks 54, it is possible to prevent the crowding of the ESD current at the channel-proximity area 42L.

Note, in the second embodiment, the ESD protection arrangement operates in substantially the same manner as the above-mentioned first embodiment shown in FIGS. 8 and 9.

Third Embodiment

Figure 11:
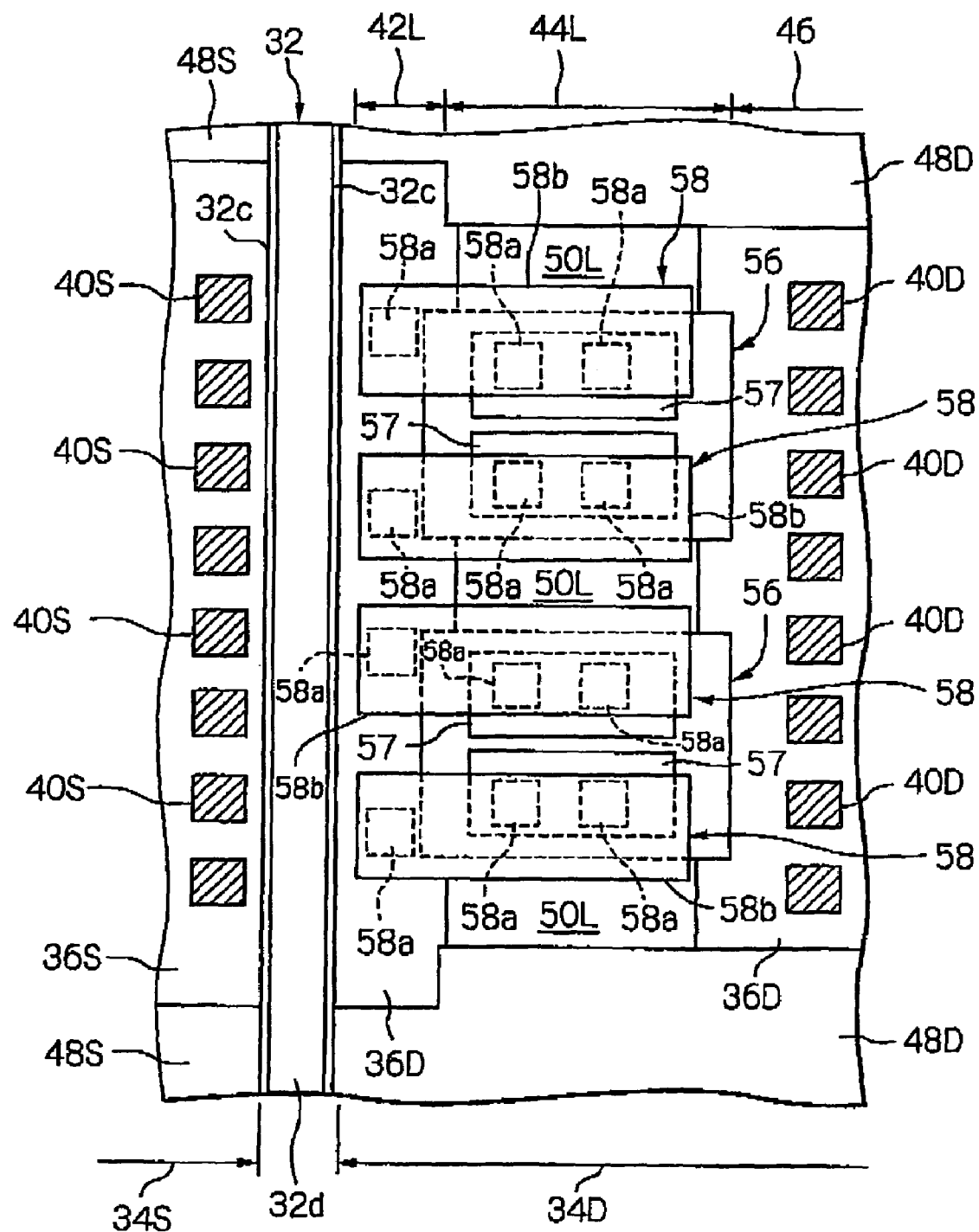
FIG. 11 is a vertical partial cross-sectional view, similar to FIG. 8, showing a third embodiment of the MOS type semiconductor device having the ESD protection arrangement according to the present invention.

FIG. 11 shows a third embodiment of the MOS type semiconductor device having the ESD protection arrangement according to the present invention. Note, in FIG. 11, the features similar to those of FIG. 9 are indicated by the same references.

In this third embodiment, two rectangular frame-like high resistance regions 56 are formed in the middle area 44L of each of the drain regions 34D as a substitute for the comb-like high resistance regions 52L, and each of the frame-like high resistance regions 56 has a beam section extending between opposed sides thereof, as shown in FIG. 11, so that an interior area of the frame-like high resistance region 56 is divided into two area sections, and each of these area sections is defined as a heat sink area or heat-radiation area 57, Of course, each of the heat-radiation areas 57 is defined as a part of the silicide layer 36D, and is electrically isolated by a corresponding frame-like high resistance region 56. Note, similar to the above-mentioned first embodiment, it is possible to form each of the frame-like high resistance regions 56 as either an STI region or an NLDD region.

Also, in the third embodiment, a floating heat sink 58 is formed in the insulating interlayer (38) at each of the drain areas 34D so as to be associated with each of the heat-radiation areas 57. In particular, each of the floating heat sinks 58 includes three metal plugs 58a formed on the silicide layer 36D formed on both the channel-proximity area 42L and the middle area 44L, and a metal layer 58b formed on the metal plugs 58a. As shown in FIG. 11, one of the three metal plugs 58a is arranged on the channel-proximity area 42L, and the remaining two metal plugs 58a are arranged on a corresponding heat-radiation area 57.

As shown in FIG. 11, each of the frame-like high resistance regions 56 partially penetrates into the silicide layer 36D formed on the channel-proximity area 42L. In short, in the third embodiment, the heat-radiation areas 57 are in no contact with the silicide layer 36D formed on the channel-proximity area 42L so as to be completely isolated by the frame like high resistance regions 56.

Note, although not illustrated in FIG. 11, a floating sink similar to the floating heat sink 68 is formed in the insulating interlayer (38) at each of the drain areas 34D so as to be associated with each of the other heat-radiation areas (53R).

According to the third embodiment, the heat-radiation areas 57 and the floating heat sinks 58 exert no influence on the ESD current circuit due to the complete isolation of the heat-radiation areas by the frame-like high resistance regions 56. Also, in the third embodiment, since each of the heat-radiation areas 57 is thermally connected to the channel-proximity area 42L through a corresponding floating heat sink 58, it is possible to sufficiently achieve the dispersion of the heat.

Note, in the third embodiment, the ESD protection arrangement operates in substantially the same manner as the above-mentioned first embodiment shown in FIGS. 8 and 9.

Fourth Embodiment

Figure 12:
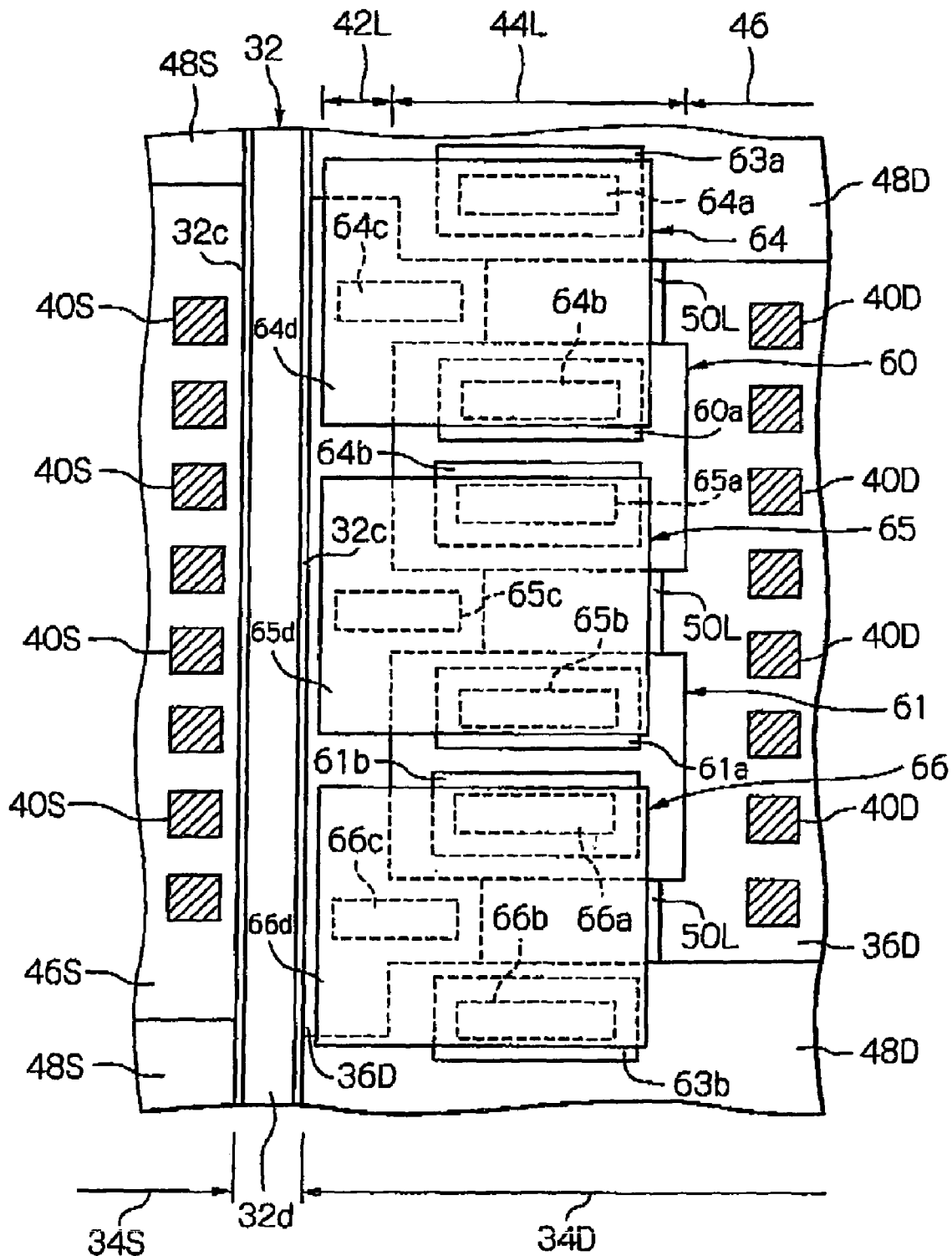
FIG. 12 is a vertical partial cross-sectional view, similar to FIG. 8, showing a fourth embodiment of the MOS type semiconductor device having the ESD protection arrangement according to the present invention.

FIG. 12 shows a fourth embodiment of the MOS type semiconductor device having the ESD protection arrangement according to the present invention. Note, in FIG. 12, the features similar to those of FIG. 9 are indicated by the same references.

Similar to the above-mentioned third embodiment, in this fourth embodiments two rectangular frame-like high resistance regions 60 and 61 are formed in the middle area 44L of each of the drain regions 34D as a substitute for the comb-like high resistance regions 52L.

The frame-like high resistance regions 60 has a beam section extending between opposed sides thereof, so that an interior area of the frame-like high resistance region 60 is divided into two area sections 60a and 60b, each of which is defined as a heat sink area or heat-radiation area. Each of the two area sections or heat-radiation areas 60a and 60b is defined as a part of the silicide layer 36D, and is electrically isolated by a corresponding frame-like high resistance region 60.

Similarly, the frame-like high resistance region 61 has a beam section extending between opposed sides thereof, so that an interior area of the frame-like high resistance region 61 is divided into two area sections 61a and 61b, each of which is defined as a heat-radiation area. Each of the two area sections or heat-radiation areas 61a and 61b is defined as a part of the silicide layer 36D, and is electrically isolated by a corresponding frame-like high resistance region 61.

Note, similar to the above-mentioned first embodiment, it is possible to form each of the frame-like high resistance regions 60 and 61 as either an STI region or an NLDD region.

Further, as shown in FIG. 12, two additional heat-radiation areas 63a and 63b are formed in the respective element-isolation layers 48D, and each of the additional heat-radiation areas 63a and 63b is defined as a part of the silicide layer 36D.

In the fourth embodiment, three floating heat sinks 64, 65 and 66 are formed in the insulating interlayer (38) so as to be associated with the heat-radiation areas 61a, 61b, 62a, 62b, 63a and 63b.

In particular, the floating heat sinks 64 are arranged so as to bridge the ballast resistance area 50L between the heat-radiation areas 63a and 60a. Namely, the floating heat sinks 64 include a rectangular metal plug 64a arranged on the heat-radiation area 63a, a rectangular metal plug 64b arranged on the heat radiating area 60a, a rectangular metal plug 64c arranged on the silicide layer 36D, formed on both the channel-proximity area 42L and the middle area 44L, at a location between the heat-radiation areas 63a and 60a, and a metal layer 64d formed on the rectangular metal plugs 64a, 64b and 64c.

Also, the floating heat sinks 65 is arranged so as to bridge the ballast resistance area 50L between the heat-radiation areas 60b and 61a. Namely, the floating heat sinks 65 include a rectangular metal plug 65a arranged on the beat-radiation area 60a, a rectangular metal plug 65b arranged on the heat radiating area 61a, a rectangular metal plug 65c arranged on the silicide layer 36D, formed on both the channel-proximity area 42L and the middle area 44L, at a location between the heat-radiation areas 60b and 61a, and a metal layer 65d formed on the rectangular metal plugs 65a, 65b and 65c.

Further, the floating heat sinks 66 are arranged so as to bridge the ballast resistance area 50L between the heat-radiation areas 61b and 63b. Namely, the floating heat sinks 66 include a rectangular metal plug 66a arranged on the heat-radiation area 61b, a rectangular metal plug 66b arranged on the heat radiating area 63b, a rectangular metal plug 66c arranged on the silicide layer 36D, formed on both the channel-proximity area 42L and the middle area 44L, at a location between the heat-radiation areas 61b and 63b, and a metal layer 66d formed on the rectangular metal plugs 66a, 66b and 66c.

Note, although not illustrated in FIG. 12, three floating sinks similar to the floating heat sinks 64, 65 and 66 are formed in the insulating interlayer (38) at each of the drain areas 34D so as to be associated with each of the other heat radiating areas (53R).

Similar to the above-mentioned third embodiment, in the fourth embodiment, the heat-radiation areas 60a, 60b, 61a, 61b, 62a, 62b, 63a and 63b the floating heat sinks 64, 65 and 66 exert no influence on the ESD current circuit due to the complete isolation of the heat-radiation areas. Also, in the fourth embodiment, since the heat-radiation areas 60a, 60b, 61a, 61b, 62a, 62b, 63a and 63b are thermally connected to the channel-proximity area 42L through the floating heat sinks 64, 65 and 66, it is possible to sufficiently achieve the dispersion of the heat.

In the fourth embodiment, since a thermal capacity of the floating heat sinks 64, 65 and 66 is considerably larger than that of the floating heat sinks 58 of the above-mentioned third embodiment, the dispersion of the heat can be further facilitated.

Note, in the fourth embodiment, the ESD protection arrangement operates in substantially the same manner as the above-mentioned first embodiment shown in FIGS. 8 and 9.

Fifth Embodiment

Figure 13:
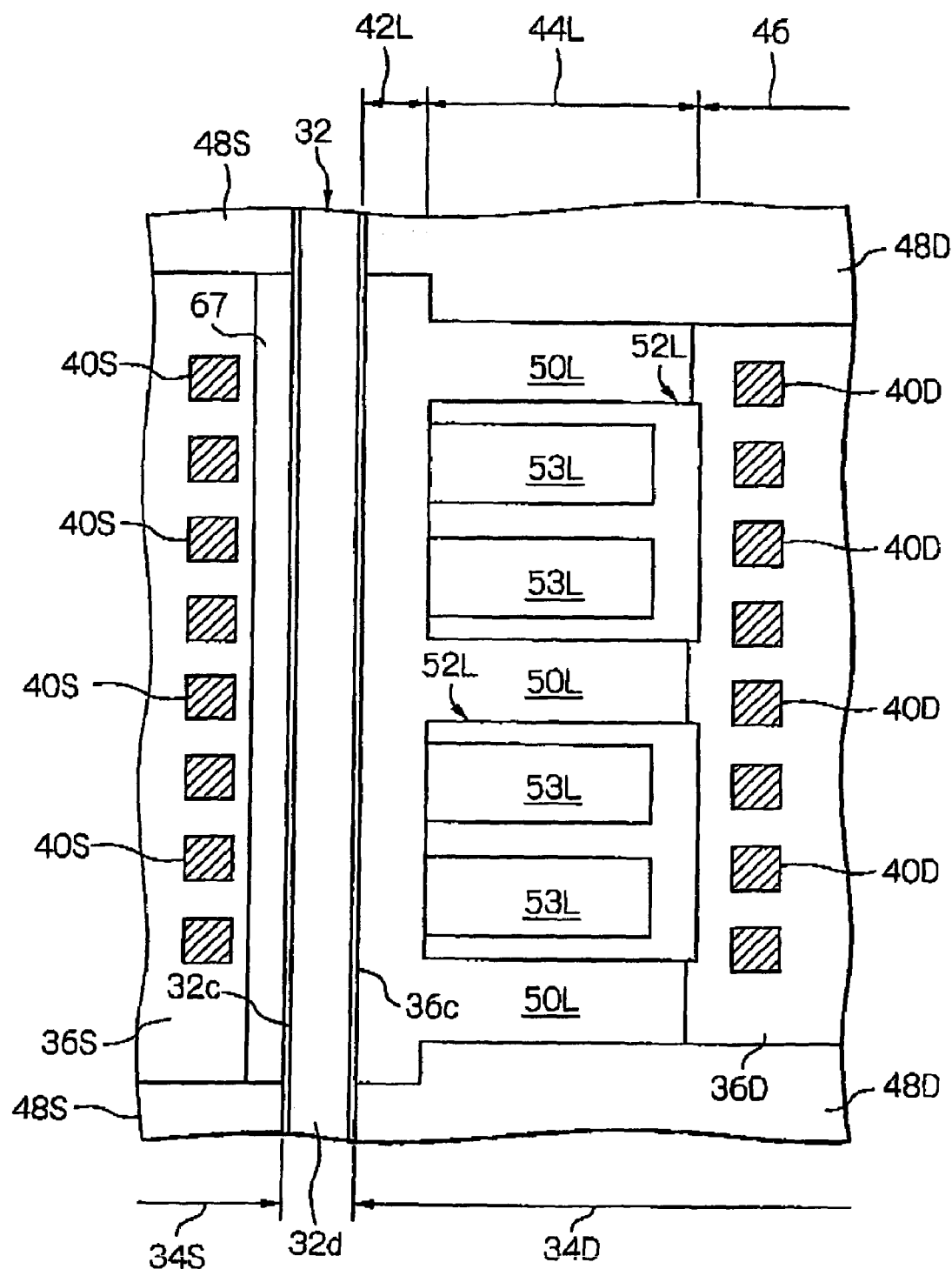
FIG. 13 is a vertical partial cross-sectional view, similar to FIG. 8, showing a fifth embodiment of the MOS type semiconductor device having the ESD protection arrangement according to the present invention.

FIG. 13 shows a fifth embodiment of the MOS type semiconductor device having the ESD protection arrangement according to the present invention. Note, in FIG. 13, the features similar to those of FIG. 9 are indicated by the same references.

In this fifth embodiment, the suicide material is blocked out from the channel-proximity area 42L so that the silicide-blocking areas or ballast resistance areas 50L are in communication with each other through the channel-proximity area 42L. Namely, a large ballast resistance area including the ballast resistance areas 50L is defined on the drain region 34D such that the comb-like high resistance areas 52L and the heat sink area or heat-radiation areas 53L are substantially surrounded by the large ballast resistance area at the drain region 34D. Also, a silicide-blocking area 67 is defined in the silicide layer 34S of the source region 36S along the elongated gate electrode 32.

The fifth embodiment is substantially identical to the above-mentioned first embodiment shown in FIGS. 8 and 9 except for the definition of both the large ballast resistance area and the silicide-blocking area 67.

Note, in the fifth embodiment, the ESD protection arrangement operates in substantially the same manner as the above-mentioned first embodiment shown in FIGS. 8 and 9.

Sixth Embodiment

Figure 14:
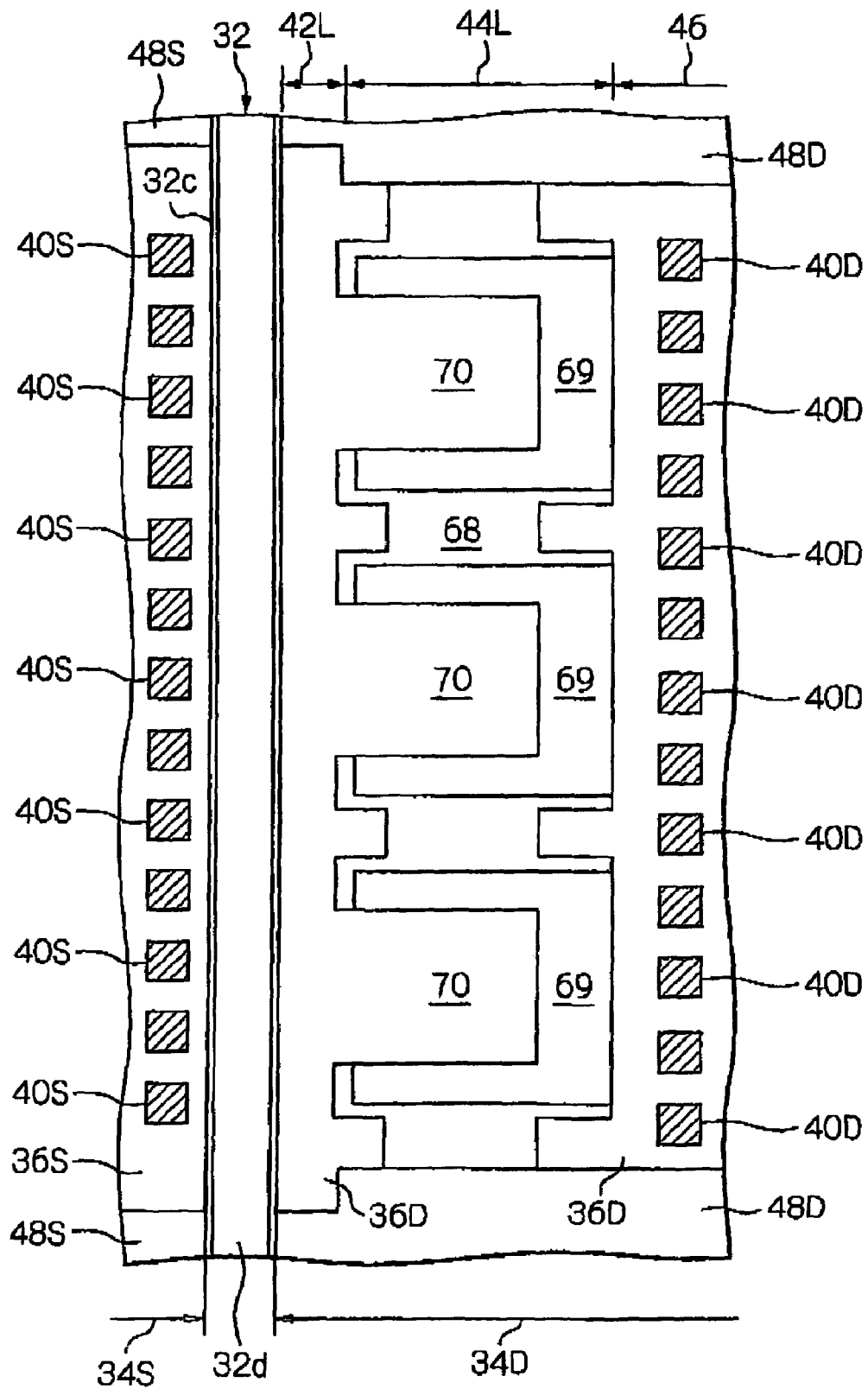
FIG. 14 is a vertical partial cross-sectional view, similar to FIG. 8, showing a sixth embodiment of the MOS type semiconductor device having the ESD protection arrangement according to the present invention.

FIG. 14 shows a sixth embodiment of the MOS type semiconductor device having the ESD protection arrangement according to the present invention. Note, in FIG. 14, the features similar to those of FIG. 9 are indicated by the same references.

In this sixth embodiment, a single silicide-blocking area or ballast resistance area 68 is formed in the silicide layer 34 so as to be extended between the element-isolation layers 48D at the middle area 44L. Also, three C-shaped high resistance regions 69 are formed in the drain region 34D as either STI regions or NLDD regions, so as to be completely included in the single ballast resistance area 68, and are arranged along the elongated gate electrode 32. Each of the C-shaped high resistance regions 69 has a beam section which is bounded on the silicide layer 36D formed on the contact-formation area 46. An interior area, which is substantially surrounded by each of the C-shaped high resistance regions 69, is defined as a heat sink area or cheat-radiation area 70.

In this sixth embodiment, each of the beat-radiation areas 70 is not defined as a part of the silicide layer 36D. Namely, each of the heat-radiation areas 70 is defined as an N$^+$-type impurity area from which the silicide material is blocked out at the middle area 44L. As shown in FIG. 14, a part of each of the heat-radiation areas 70 is protruded from a corresponding C-shaped high resistance region 69, and is bounded on the silicide layer 43D formed on the channel-proximity area 42L. Note, the heat-radiation areas or N$^+$-type impurity area 70 exhibit a thermal conductivity superior to that of the C-shaped high resistance regions 69, each of which is formed as either an STI region or an NLDD region.

In the sixth embodiment, the heat-radiation areas 70 do not participate in the formation of the ESD current circuit, because they are electrically isolated by the C-shaped high resistance regions 69.

Note, in the sixth embodiment, the ESD protection arrangement operates in substantially the same manner as the above-mentioned first embodiment shown in FIGS. 8 and 9.

Seventh Embodiment

Figure 15:
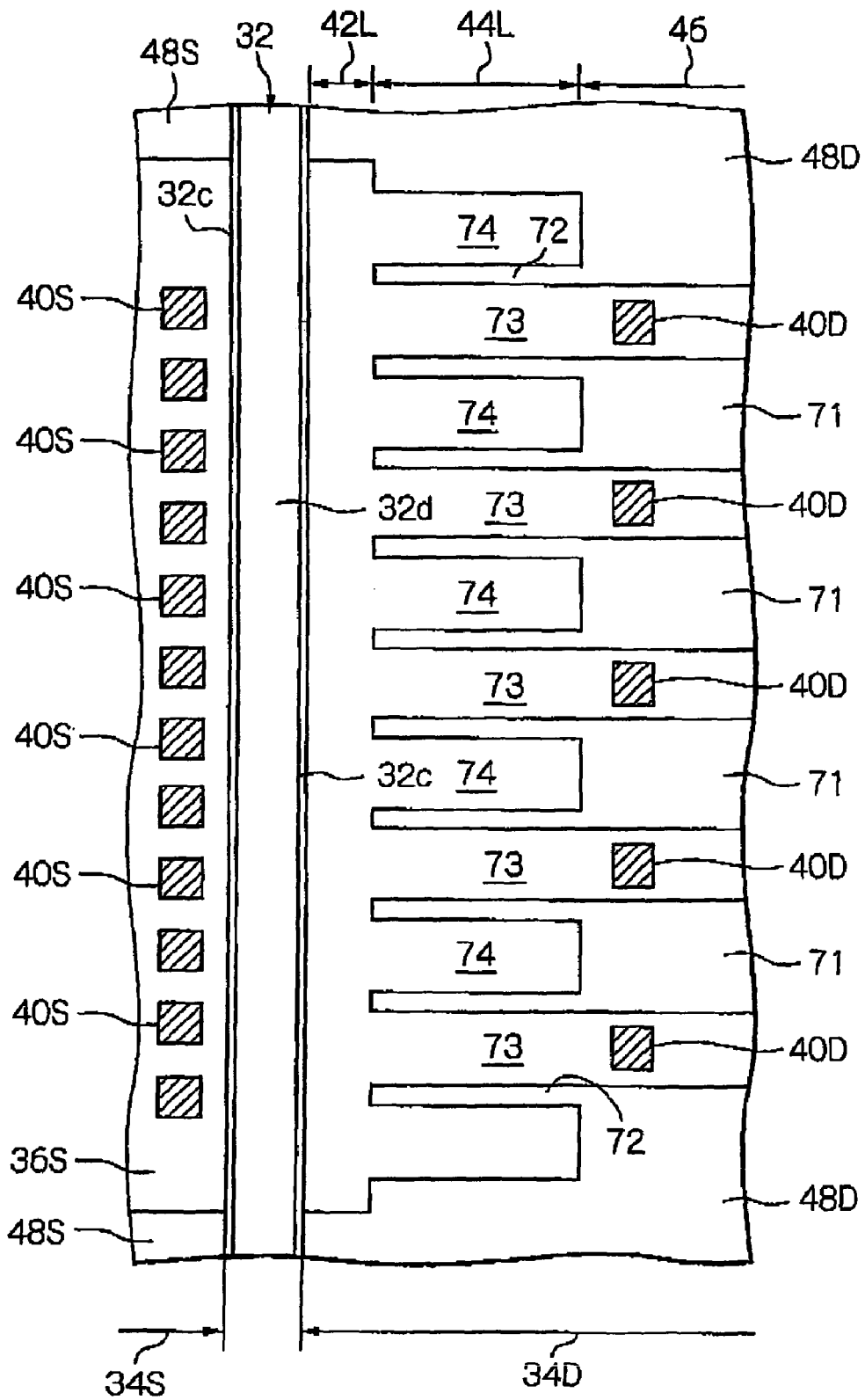
FIG. 15 is a vertical partial cross-sectional view, similar to FIG. 8, showing a seventh embodiment of the MOS type semiconductor device having the ESD protection arrangement according to the present invention.

FIG. 15 shows a seventh embodiment of the MOS type semiconductor device having the ESD protection arrangement according to the present invention. Note, in FIG. 15, the features similar to those of FIG. 9 are indicated by the same references.

In this seventh embodiment, four fork-like high resistance regions 71 are formed in the drain region 34D as either STI regions or the NLDD regions at both the middle area 44L and the contact-formation area 46. Also, each of the element-isolations 48D is shaped so that a semi-fork-like section 72 is defined therein. The fork-like high resistance regions 71 and the semi-fork-like sections 72 are arranged along the elongated gate electrode 32 at regular intervals, so that a plurality of web-like areas 73 are defined so as to be integrally extended from the silicide layer 36D, formed on the channel-proximity area 42L, into both the middle area 44L and the contact-formation area 46. Each of the web-like areas 73 is defined as a part of the silicide layer 36D, and these web-like areas 73 are defined as ballast resistance areas which are narrowed by the arrangement of the fork-like high resistance regions 71 and semi-fork-like sections 72. As shown in FIG. 15, the respective contact plugs 40D are arranged on and contacted with the web-like areas or ballast resistance areas 74 at the contact-formation area 46.

Also, a plurality of strip-like sections 74 are formed by the arrangement of the fork-like high resistance regions 71 and semi-fork-like sections 72, and each of the strip-like sections 74 is defined as a heat sink area or heat-radiation area which is integrally extended from the silicide layer 36D, formed on the channel-proximity area 42L, into the middle area 44L. Each of the strip-like sections or heat-radiation areas 72 is defined as a part of the silicide layer 36D.

In short, in the seventh embodiment, no silicide-blocking area is formed in the drain region 36D. In other words, in this embodiment, it is possible to omit a process for forming silicide-blocking areas in the drain region 36D, resulting in contribution to decline of production cost of NOS type semiconductor devices.

In the seventh embodiment, the heat-radiation areas 74 do not participate in the formation of the ESD current circuit, because they are electrically isolated by the arrangement of the fork-like high resistance regions 71 and semi-fork-like sections 72.

Note, in the seventh embodiment, the ESD protection arrangement operates in substantially the same manner as the above-mentioned first embodiment shown in FIGS. 8 and 9.

Eighth Embodiment

Figure 16:
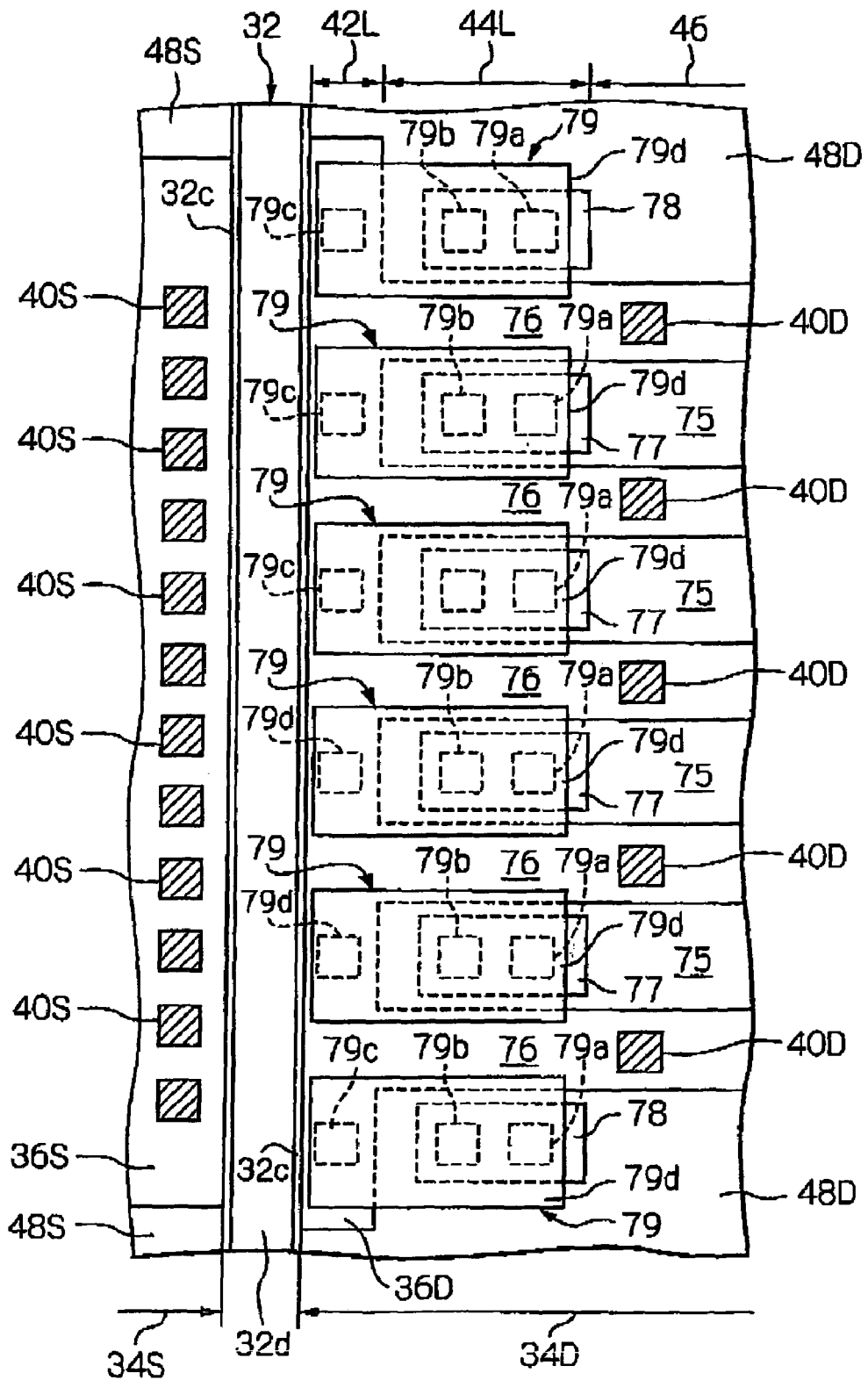
FIG. 16 is a vertical partial cross-sectional view, similar to FIG. 8, showing an eighth embodiment of the MOS type semiconductor device having the ESD protection arrangement according to the present invention.

FIG. 16 shows an eighth embodiment of the MOS type semiconductor device having the ESD protection arrangement according to the present invention. Note, in FIG. 16, the features similar to those of FIG. 9 are indicated by the same references.

In this eighth embodiment, four strip-like high resistance regions 75 are formed in the drain region 34D as either STI regions or the NLDD regions at both the middle area 44L and the contact-formation area 46, and are arranged along the elongated gate electrode 32 at regular intervals, so that a plurality of web-like areas 76 are defined therebetween so as to be integrally extended from the silicide layer 36D, formed on the channel-proximity area 42L, into both the middle area 44L and the contact-formation area 46. Each of the web-like areas 76 is defined as a part of the silicide layer 36D, and these web-like areas 76 are defined as ballast resistance areas which are narrowed by the arrangement of the strip-like high resistance regions 75. As shown in FIG. 16, the respective contact plugs 40D are arranged on and contacted with the web-like areas or ballast resistance areas 76 at the contact-formation area 46.

As shown in FIG. 16, a rectangular heat sink area or heat-radiation area 77 is formed in an end portion of each of the strip-like high resistance regions 75, and a rectangular heat-radiation area 78 is formed in each of the element-isolation layers 48D, with the rectangular heat-radiation areas 77 and 78 being arranged at regular intervals. Each of the rectangular heat-radiation areas 77 and 78 is defined as a part of the silicide layer 36D.

In short, in the eighth embodiment, no silicide-blocking area is formed in the drain region 36D. In other words, in this embodiment, it is also possible to omit a process for forming silicide-blocking areas in the drain region 36D, resulting in contribution to decline of production is cost of MOS type semiconductor devices.

A conductive floating heat sink 79 is formed in the insulating interlayer (38) at both the channel-proximity area 42L and the middle area 44 of the drain region 36D so as to be associated with a corresponding rectangular heat-radiation area (77, 78). Namely, the floating heat sink 79 includes two metal plugs 79a and 79b arranged on the rectangular heat-radiation area (77, 78), a metal plug 79c arranged on the silicide layer 36D formed on the channel-proximity area 42L, and a metal layer 79d formed on the metal plugs 79a, 79b and 79c.

In the eighth embodiment, the heat-radiation areas 74 do not participate in the formation of the ESD current circuit, because they are electrically and completely isolated by the element-isolation layers 48D and strip-like high resistance areas 75. Also, it is possible to facilitate the dispersion of heat in comparison with the above-mentioned seventh embodiment due to the existence of the floating heat sinks 79.

Note, in the eighth embodiment, the ESD protection arrangement operates in substantially the same manner as the above-mentioned first embodiment shown in FIGS. 8 and 9.

Ninth Embodiment

Figure 17:
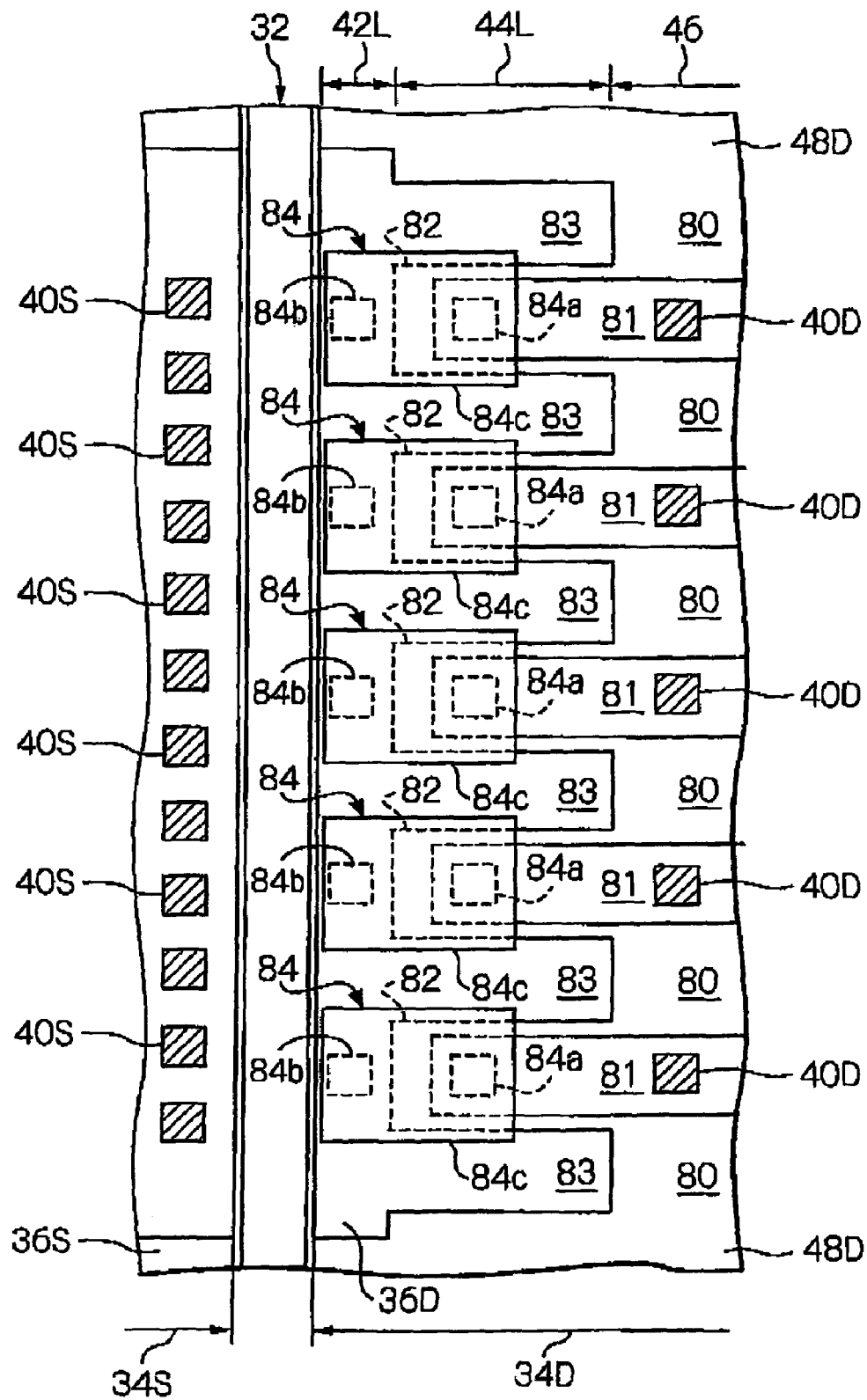
FIG. 17 is a vertical partial cross-sectional view, similar to FIG. 8, showing a ninth embodiment of the MOS type semiconductor device having the ESD protection arrangement according to the present invention.

FIG. 17 shows a ninth embodiment of the MOS type semiconductor device having the ESD protection arrangement according to the present invention. Note, in FIG. 17, the features similar to those of FIG. 9 are indicated by the same references.

In this ninth embodiment, six strip-like high resistance regions 80 are formed in the drain region 34D as either STI regions or the NLDD regions at both the middle area 44L and the contact-formation area 46, and are arranged along the elongated gate electrode 32 at regular intervals, so that a plurality of web-like areas 81 are defined therebetween at both the middle area 44L and the contact-formation area 46. Each of the web-like areas 81 is defined as a ballast resistance area having a polycrystalline silicon layer formed thereon.

Note, as shown in FIG. 17, the outermost strip-like high resistance regions 80 are integrated with the element-isolation layers 48D.

Also, five U-shaped high resistance sections 82 are formed in the middle area 44L so that each of the U-shaped high resistance sections 82 is integrated with two adjacent strip-like high resistance regions 80, and so that each of the U-shaped high resistance sections 82 concerned is extended along an end portion of the web-like area 81 defined between the two adjacent strip-like high resistance region 80. Note, both the formation of the strip-like high resistance regions 80 and the formation of the U-shaped high resistance sections 82 are simultaneously carried out. As shown in FIG. 17, the respective contact plugs 40D are arranged on and contacted with the web-like areas or ballast resistance areas 81 at the contact-formation area 46.

Also, a plurality of strip-like sections 83 are formed by the arrangement of the strip-like high resistance regions 80, and each of the strip-like sections 83 is defined as a heat sink area or heat-radiation area which is integrally extended from the suicide layer 36D, formed on the channel-proximity area 42L, into the middle area 44L. Each of the strip-like sections forms a heat sink area or heat-radiation areas 83, and is defined as a part of the silicide layer 36D.

The end portions of the web-like areas 81 are electrically connected to the silicide layer 36D, formed on the channel-proximity area 42L, through conductive paths 84 which are formed in the insulating interlayer (38). Each of the conductive paths 84 includes a via plug 84a arranged on an end portion of a corresponding ballast resistance areas 81, a via plug 84b arranged on the silicide layer 36D formed on the channel-proximity area 42L, and a metal layer 84c formed on the via plugs 84a and 84b, whereby the electrical connections are established between the ballast resistance areas 81 and the channel-proximity area 42L.

In this eighth embodiment, since each of the ballast resistance areas 81 is composed of polycrystalline silicon, a resistance at each ballast resistance area 81 varies in accordance with temperature. Namely, when an ESD current flows through one of the ballast resistance areas 81, and when the temperature of the ballast resistance area concerned is raised, the resistance thereof becomes large, whereby it is possible to prevent crowding of the ESD current.

Note, in the ninth embodiment, the ESD protection arrangement operates in substantially the same manner as the above-mentioned first embodiment shown in FIGS. 8 and 9.

Tenth Embodiment

Figure 18:
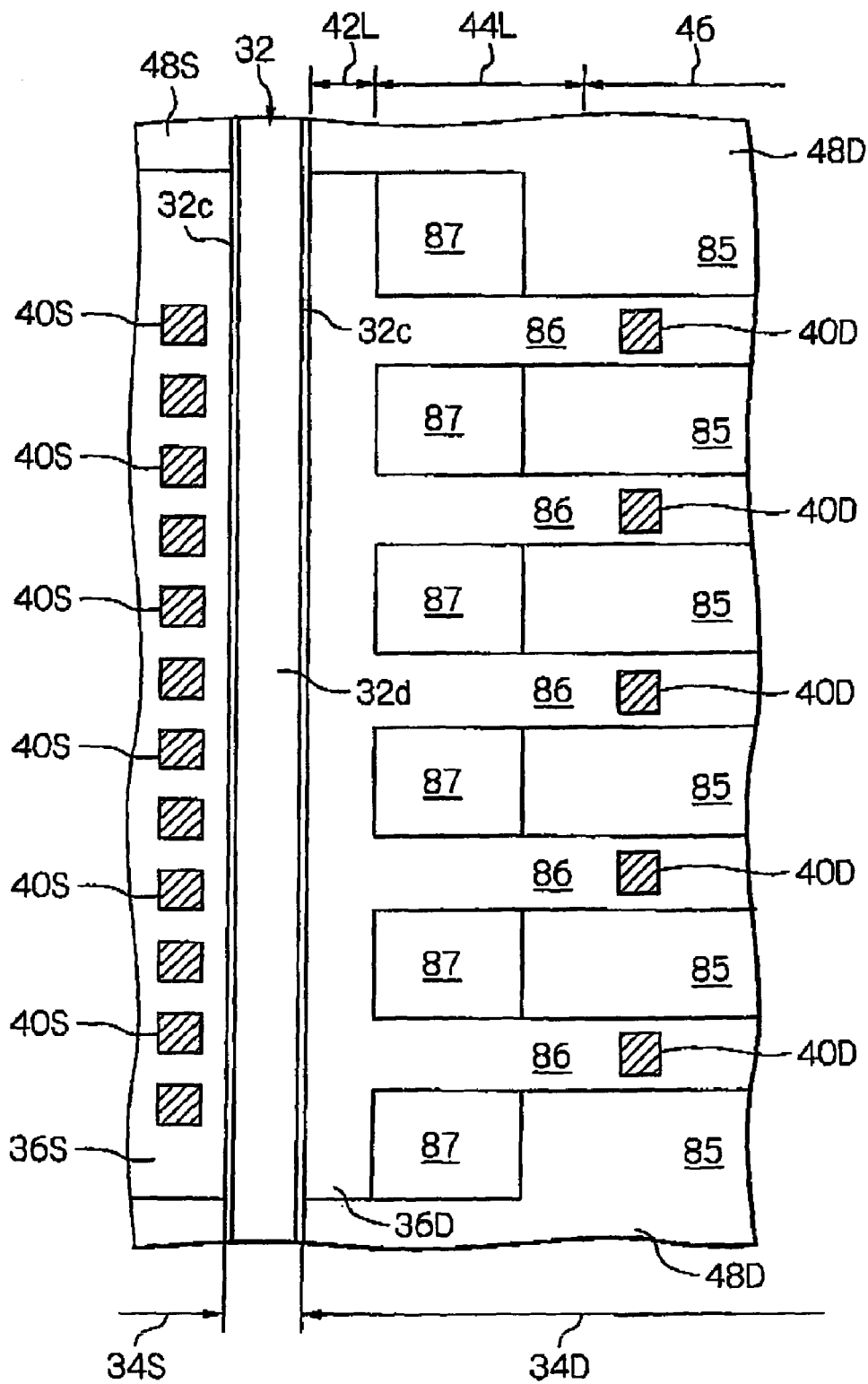
FIG. 18 is a vertical partial cross-sectional view, similar to FIG. 8, showing a tenth embodiment of the MOS type semiconductor device having the ESD protection arrangement according to the present invention.

FIG. 18 shows a tenth embodiment of the MOS type semiconductor device having the ESD protection arrangement according to the present invention. Note, in FIG. 18, the features similar to those of FIG. 9 are indicated by the same references.

In this tenth embodiment, six strip-like high resistance regions 85 are formed in the drain region 34D as either STI regions or the NLDD regions at both the middle area 44L and the contact-formation area 46, and are arranged along the elongated gate electrode 32 at regular intervals, so that a plurality of web-like areas 86 are defined therebetween at both the middle area 44L and the contact-formation area 46. Each of the web-like areas 86 is defined as a ballast resistance area which is defined as a part of the silicide layer 36D. As shown in FIG. 18, the respective contact plugs 40D are arranged on and contacted with the web-like areas or ballast resistance areas 86 at the contact-formation area 46.

Note, as shown in FIG. 18, the outermost strip-like high resistance regions 85 are integrated with the element-isolation layers 48D.

In the tenth embodiment, a plurality of heat sink areas or heat-radiation areas 87 are formed on the middle area 44L, and are arranged along the elongated gate electrode 32. Each of the heat-radiation areas 87 is not defined as a part of the silicide layer 36D. Namely, each of the heat-radiation areas 87 is defined as an $N^+$-type impurity area from which the silicide material is blocked out at the middle area 44L. As shown in FIG. 18, each of the heat-radiation areas 87 is bounded on a corresponding strip-like high resistance regions 85.

As stated above, a sheet resistance of the web-like areas or ballast resistance areas 86 is approximately 10 $\Omega/\square$, and a sheet resistance of the heat-radiation areas ($N^+$-type impurity region) 87 is approximately 100 $\Omega/\square$ higher than that of the silicide layer 36D, which may be on the order of 10 $\Omega/\square$. Thus, the heat-radiation areas 87 do not participate in the formation of the ESD current circuit.

Also, the heat-radiation areas or $N^+$-type impurity area 87 exhibit a thermal conductivity superior to that of the strip-like high resistance regions 85, each of which is formed the STI regions or the NLDD regions. Thus, it is possible to sufficiently disperse heat, which is generated in the vicinity of the PN junction between the drain region 34D and the channel region 34C.

Note, in the tenth embodiment, the ESD protection arrangement operates in substantially the same manner as the above-mentioned first embodiment shown in FIGS. 8 and 9.

Eleventh Embodiment

Figure 19:
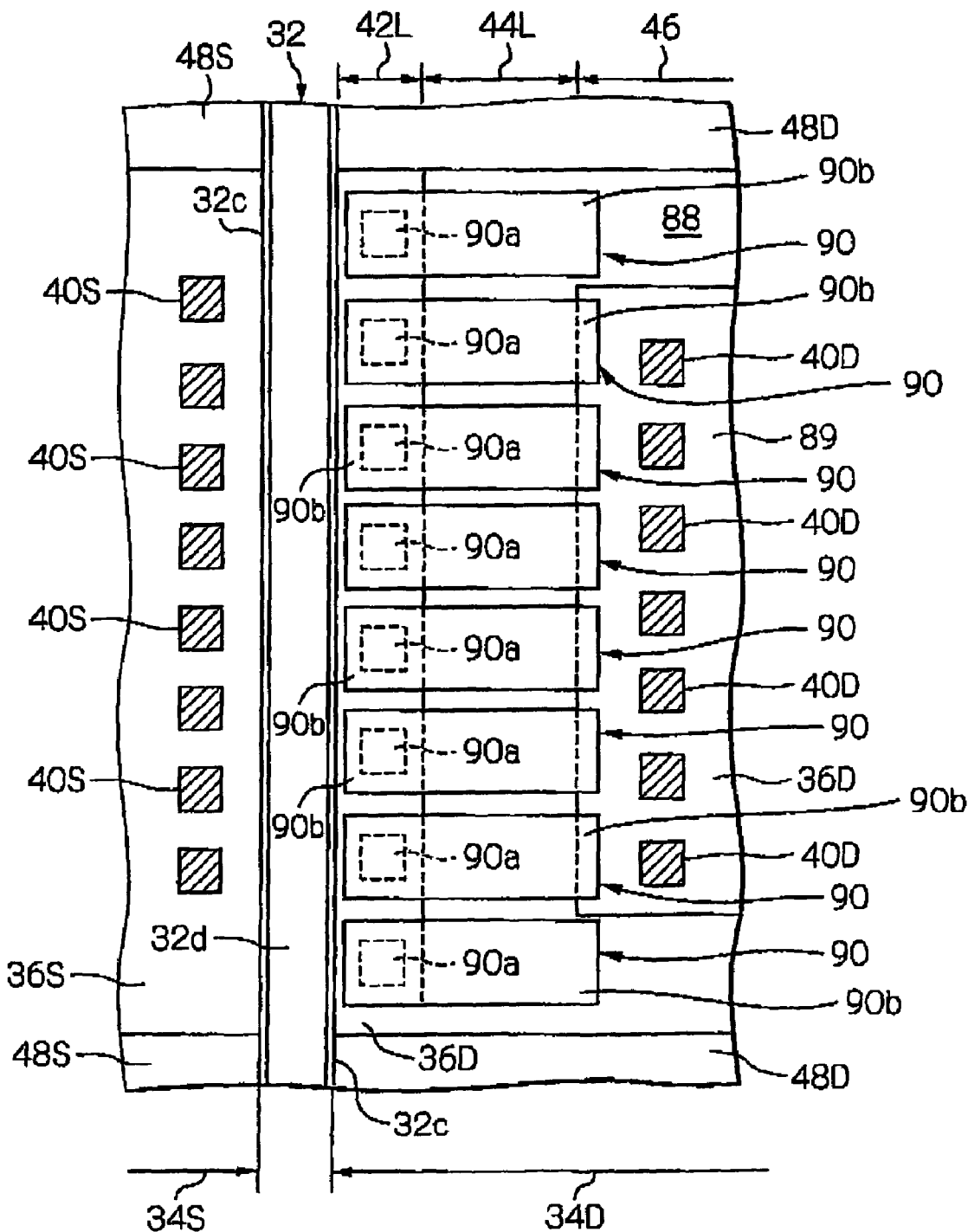
FIG. 19 is a vertical partial cross-sectional view, similar to FIG. 8, showing an eleventh embodiment of the MOS type semiconductor device having the ESD protection arrangement according to the present invention.

FIG. 19 shows an eleventh embodiment of the MOS type semiconductor device having the ESD protection arrangement according to the present invention. Note, in FIG. 19, the features similar to those of FIG. 9 are indicated by the same references.

In this eleventh embodiment, an annular silicide blocking area 88 is formed in the drain region 34D such that the array of contact plugs 40D is surrounded by the annular silicide blocking area 88. Namely, a suicide area 89 is left as an island in the contact-formation area 46, and is defined as a part of the silicide layer 36D. As shown in FIG. 19, the contact plugs 40D are arranged on and contacted with the suicide area 89.

Also, a plurality of floating heat sinks 90 are formed in the insulating interlayer (38) so as to be arranged along the channel-proximity area 42L. In particular, each of the floating heat sinks 90 comprises a metal plug 90a arranged on and contacted with the silicide layer 36D formed on the channel-proximity area 42L, and a metal layer 90b formed on the metal plug 90a. As shown in FIG. 19, the metal layer 90b is connected to the metal plug at one end thereof, and the other end is free. For example, the metal plugs 90a are aligned with each other at regular intervals of 0.5 μm, and each of the metal plugs 90a is spaced from the elongated gate electrode 32 by a distance of less than 0.5 μm.

The floating heat sinks 90 as a whole have a relatively large thermal capacity, so it is possible to facilitate the dispersion of the heat. Also, since the floating heat sinks 90 are formed in the insulating interlayer (38) in a floating state, the floating heat sinks 90 exert no influence on the ESD current circuit.

Note, in the eleventh embodiment, the ESD protection arrangement operates in substantially the same manner as the above-mentioned first embodiment shown in FIGS. 8 and 9.

Twelfth Embodiment

Figure 20:
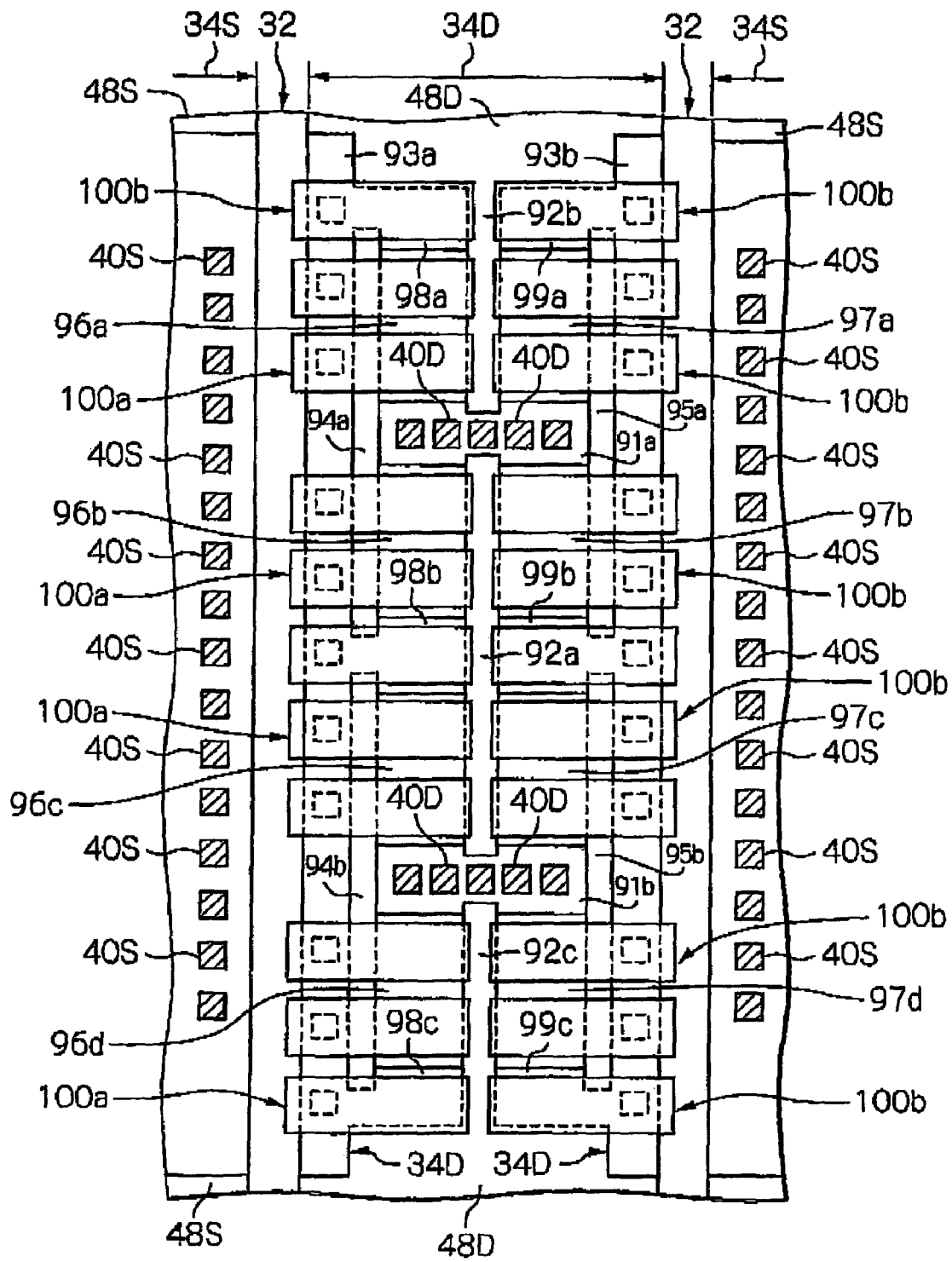
FIG. 20 is a vertical partial cross-sectional view, similar to FIG. 8, showing a twelfth embodiment of the MOS type semiconductor device having the ESD protection arrangement according to the present invention.

FIG. 20 shows a twelfth embodiment of the MOS type semiconductor device having the ESD protection arrangement according to the present invention. Note, in FIG. 20, the features similar to those of FIG. 9 are indicated by the same references.

In this twelfth embodiment, two central silicide areas 91a and 91b are formed along a longitudinal central axis of the drain region 34D, and each of the central silicide areas 91a and 91b is defined as a part of the silicide layer 36D. As shown in FIG. 20, contact plugs 40D are arranged on each of the central silicide areas 91a and 91b.

A central elongated high resistance region 92a is formed in the drain region 34D so as to be extended between the central silicide areas 91a and 91b. A central elongated high resistance region 92b is formed in the drain region 34D so as to be extended between the central silicide area 91a and the element-isolation layer 48D, which are opposed to each other. Similarly, a central elongated high resistance region 92c is formed in the drain region 34D so as to be extended between the central silicide area 91b and the element-isolation layer 48D, which are opposed to each other.

Note, it is possible to form the elongated high resistance regions 92a, 92b and 92c as either STI regions or the NLDD regions, and the respective elongated high resistance regions 92b and 91c are integrated with the element-isolation layers 48D.

Respective channel-proximity areas 93a and 93b are formed along the two elongated gate electrodes 32, and each of the channel-proximity areas 93a and 93b is defined as a part of the silicide layer 34D. Two side elongated high resistance regions 94a and 74b are formed along the channel-proximity area 93a as either STI regions or the NLDD regions. Similarly, two side elongated high resistance regions 95a and 75b are formed along the channel-proximity area 93b as either STI regions or the NLDD regions.

Four silicide-blocking areas 96a, 96b, 96c and 96d are formed along both the side elongated high resistance regions 94a and 94b, and each of the silicide-blocking areas 96a, 96b and 96c serves as a conductive area. Similarly, silicide-blocking areas 97a, 97b, 97c and 97d are formed along both the side elongated high resistance regions 95a and 95b, and each of the silicide-blocking areas 97a, 97b and 97c serves as a conductive area.

The conductive area 96a is extended from the silicide area 91a to a silicide area 98a, which is integrally protruded From the channel-proximity area 93a, and the conductive area 96b is extended from the silicide area 91a to a silicide area 98b, which is integrally protruded from the channel-proximity area 93a. Also, the conductive area 96c is extended from the silicide area 98b to the silicide area 91b, and the conductive area 96d is extended from the silicide area 91b to a silicide area 98c, which is integrally protruded from the channel-proximity area 93a.

The conductive area 97a is extended from the silicide area 91a to a silicide area 99a, which is integrally protruded from the channel-proximity area 93b, and the conductive area 97b is extended from the silicide area 91a to a silicide area 99b, which is integrally protruded from the channel-proximity area 93b. Also, the conductive area 97c is extended from the silicide area 99b to the silicide area 91b, and the conductive area 97*d* is extended from the silicide area 91*b* to a silicide area 99*c*, which is integrally protruded from the channel-proximity area 93*a*.

As is apparent from FIG. 20, each of the conductive areas 96*a*, 96*b*, 96*c*, 96*d*, 97*a*, 97*b*, 97*c* and 97*d* are suitably isolated by two or three of the elongated high resistance regions 92*a*, 92*b*, 92*c*, 94*a*, 94*b*, 95*a* and 95*b*.

Also, a plurality of floating heat sinks 100*a* are formed in the insulating interlayer (38) so as to be arranged along the channel-proximity area 93*a*, and a plurality of floating heat sinks 10*b* are formed in the insulating interlayer (38) so as to be arranged along the channel-proximity area 93*b*. Each of the floating heat sinks 100*a* and 100*b* is substantially identical to the floating heat sink 90 shown in FIG. 19. Namely, the floating heat sink (100*a*, 100*b*) comprises a metal plug arranged on and contacted with the channel-proximity area (93*a*, 93*b*), and a metal layer formed on the metal plug.

In the twelfth embodiment, the ESD protection arrangement includes an ESD current circuit formed of the input/output pads, the contact plugs 40D, the silicide area (91*a*, 91*b*), the conductive area (96*a*, 96*b*, 96*c*, 96*d*, 97*a*, 97*b*, 97*c*, 97*d*), the silicide area (98*a*, 98*b*, 98*c*, 99*a*, 99*b*, 99*c*), the channel-proximity area (93*a*, 93*b*), the channel region (34C), the source region (34S), and the contact plugs 40S.

The floating heat sinks (100*a*, 119*b*) as a whole have a relatively large thermal capacity, it is possible to facilitate the dispersion of the heat. Also, since the floating heat sinks 90 are formed in the insulating interlayer (38) in a floating state, the floating heat sinks 90 exert no influence on the ESD current circuit.

Note, in the twelfth embodiment, the ESD protection arrangement operates in substantially the same manner as the above-mentioned first embodiment shown in FIGS. 8 and 9.

Finally, it will be understood by those skilled in the art that the foregoing description is of preferred embodiments of the method and the device, and that various changes and modifications may be made to the present invention without departing from the spirit and scope thereof.

The invention claimed is:

1. A semiconductor device having an electrostatic discharge protection arrangement, which comprises:
   a semiconductor substrate exhibiting a first conductivity type;
   a first impurity region formed in said semiconductor substrate and exhibiting a second conductivity type;
   a second impurity region formed in said semiconductor substrate and exhibiting the second conductivity type;
   a channel region formed in said semiconductor substrate between said first and second impurity regions;
   a first conductive area defined on said first impurity region in the vicinity of said channel region;
   a second conductive area defined on said first impurity region so as to be supplied with an electrostatic discharge current;
   a third conductive area defined on said first impurity region to establish an electrical connection between said first and second conductive area; and
   at least one heat-radiation area defined in said third conductive area so as to be at least partially isolated therefrom and thermally contacted with said first conductive area.

2. The semiconductor device as set forth in claim 1, further comprising a high resistance region formed in said first impurity region for the at least partial isolation of said heat-radiation area.

3. The semiconductor device as set forth in claim 1, further comprising a floating heat sink which is in thermal contact with said heat-radiation area.

4. The semiconductor device as set forth in claim 3, wherein said floating heat sink is in thermal contact with said first conductive area.

5. The semiconductor device as set forth in claim 1, wherein said heat-radiation area has a silicide layer formed thereon.

6. The semiconductor device as set forth in claim 1, wherein said first impurity region has a silicide layer formed thereon, said third conductive area is defined as a silicide-blocking area.

7. The semiconductor device as set forth in claim 6, wherein said heat-radiation area is arranged in and isolated from said silicide-blocking area.

8. The semiconductor device as set forth in claim 1, further comprising a conductive floating heat sink associated with said first conductive area and said third conductive area to thereby establish an electrical connection therebetween.

9. The semiconductor device as set forth in claim 8, wherein said third conductive area is isolated from said first conductive area.

10. The semiconductor device as set forth in claim 1, wherein a plurality of heat-radiation areas are defined in said third conductive area so that said third conductive area is divided into conductive area sections, which are extended between said first and second conductive areas.

11. The semiconductor device as set forth in claim 10, wherein said second conductive area is divided into conductive area sections by high resistance regions formed in said first impurity region, the respective conductive sections of said third conductive area being connected to the conductive area sections of said second conductive area.

12. The semiconductor device as set forth in claim 11, wherein each of the conductive area sections of said second conductive area has a contact plug formed thereon.

13. The semiconductor device as set forth in claim 1, wherein said heat-radiation area is defined as an exposed surface of said first impurity region.

14. The semiconductor device as set forth in claim 1, wherein said heat-radiation area is defined as a layer composed of a material, a resistance of which becomes higher in accordance with a raise in temperature.

15. The semiconductor device as set forth in claim 14, wherein said material is polycrystalline silicon.

16. A semiconductor device having an electrostatic discharge protection arrangement, which comprises:
   a semiconductor substrate exhibiting a first conductivity type;
   a first impurity region formed in said semiconductor substrate and exhibiting a second conductivity type;
   a second impurity region formed in said semiconductor substrate and exhibiting the second conductivity type;
   a channel region formed in said semiconductor substrate between said first and second impurity regions;
   a first conductive area defined on said first impurity region in the vicinity of said channel region;
   a second conductive area defined on said first impurity region so as to be supplied with an electrostatic discharge current;
   a third conductive area defined on said first impurity region to establish an electrical connection between said first and second conductive area; and
   a plurality of floating heat sinks associated with said first conductive area and arranged along said channel region.

17. The semiconductor device as set forth in claim 16, wherein said third conductive area is defined as an annular area surrounding said second conductive area section.

18. The semiconductor device as set forth in claim 16, wherein said third conductive area is divided into conductive area sections, each of said conductive area sections being isolated by high resistance regions formed in said first impurity region.

* * * * *